(12) United States Patent
Nagashima

(10) Patent No.: US 10,002,880 B1
(45) Date of Patent: Jun. 19, 2018

(54) SEMICONDUCTOR DEVICE AND METHOD FOR MANUFACTURING SAME

(71) Applicant: Toshiba Memory Corporation, Minato-ku (JP)

(72) Inventor: Satoshi Nagashima, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days. days.

(21) Appl. No.: 15/695,245

(22) Filed: Sep. 5, 2017

(30) Foreign Application Priority Data

Mar. 30, 2017 (JP) ................. 2017-068002

(51) Int. Cl.
| | |
|---|---|
| *H01L 27/115* | (2017.01) |
| *H01L 27/11582* | (2017.01) |
| *H01L 21/768* | (2006.01) |
| *H01L 27/11556* | (2017.01) |
| *H01L 23/522* | (2006.01) |

(52) U.S. Cl.
CPC .. *H01L 27/11582* (2013.01); *H01L 21/76802* (2013.01); *H01L 21/76877* (2013.01); *H01L 23/5226* (2013.01); *H01L 27/11556* (2013.01); *H01L 2221/1042* (2013.01)

(58) Field of Classification Search
CPC ......... H01L 27/11582; H01L 21/76877; H01L 23/5226; H01L 21/76802; H01L 27/11556; H01L 2221/1042; H01L 21/7682; H01L 21/764; H01L 21/76264
See application file for complete search history.

(56) References Cited

U.S. PATENT DOCUMENTS

| | | | | |
|---|---|---|---|---|
| 7,799,672 B2 * | 9/2010 | Hashimoto | ....... | H01L 27/11575 257/E21.645 |
| 7,847,334 B2 * | 12/2010 | Katsumata | ............ | H01L 21/764 257/314 |
| 7,910,432 B2 * | 3/2011 | Tanaka | .............. | H01L 27/11582 257/324 |
| 7,989,880 B2 * | 8/2011 | Wada | ................ | H01L 21/76808 257/314 |
| 8,304,348 B2 * | 11/2012 | Hashimoto | ....... | H01L 27/11582 438/618 |

(Continued)

FOREIGN PATENT DOCUMENTS

| | | |
|---|---|---|
| JP | 2015-170692 | 9/2015 |
| WO | WO 2015/105049 A2 | 7/2015 |

*Primary Examiner* — Earl Taylor
(74) *Attorney, Agent, or Firm* — Oblon, McClelland, Maier & Neustadt, L.L.P.

(57) ABSTRACT

According to one embodiment, an insulating layer is provided above a word line contact region portion. An upper surface of the insulating layer is at a height higher than an uppermost conductive layer. A first cover film is provided between the word line contact region portion and the insulating layer. A second cover film included in a first separation portion covers a side surface along a first direction of the insulating layer and a side surface along the first direction of the word line contact region portion. A third cover film is provided on the uppermost conductive layer. The third cover film covers a side surface along a second direction of the insulating layer. The first, second, and third cover films are of materials different from a material of the insulating layer.

20 Claims, 26 Drawing Sheets

(56) References Cited

U.S. PATENT DOCUMENTS

| | | | | |
|---|---|---|---|---|
| 8,822,322 B2* | 9/2014 | Lee | H01L 27/11578 | 257/E21.645 |
| 8,890,229 B2* | 11/2014 | Watanabe | H01L 29/7926 | 257/314 |
| 8,912,593 B2* | 12/2014 | Matsuda | H01L 29/66833 | 257/314 |
| 9,362,303 B2* | 6/2016 | Lee | H01L 27/11582 | |
| 9,633,945 B1* | 4/2017 | Mizutani | H01L 27/1157 | |
| 9,911,753 B2* | 3/2018 | Kitamura | H01L 27/11582 | |
| 2007/0252201 A1* | 11/2007 | Kito | H01L 21/8221 | 257/331 |
| 2009/0230458 A1* | 9/2009 | Ishiduki | H01L 27/11565 | 257/324 |
| 2009/0242968 A1* | 10/2009 | Maeda | H01L 27/11551 | 257/324 |
| 2010/0059811 A1* | 3/2010 | Sekine | H01L 21/28282 | 257/324 |
| 2010/0207240 A1* | 8/2010 | Hashimoto | H01L 27/11578 | 257/532 |
| 2011/0031546 A1* | 2/2011 | Uenaka | H01L 21/28282 | 257/316 |
| 2012/0052674 A1* | 3/2012 | Lee | H01L 27/11578 | 438/591 |
| 2012/0112171 A1* | 5/2012 | Hattori | H01L 27/1157 | 257/40 |
| 2012/0171861 A1* | 7/2012 | Park | H01L 21/31144 | 438/639 |
| 2012/0184078 A1* | 7/2012 | Kiyotoshi | H01L 27/1157 | 438/268 |
| 2012/0211821 A1* | 8/2012 | Matsumoto | H01L 27/11582 | 257/324 |
| 2013/0062683 A1* | 3/2013 | Fukuzumi | H01L 29/66833 | 257/324 |
| 2013/0087846 A1* | 4/2013 | Lee | H01L 27/11582 | 257/324 |
| 2013/0130468 A1* | 5/2013 | Higashitani | H01L 29/7926 | 438/382 |
| 2013/0248965 A1* | 9/2013 | Nakai | H01L 29/788 | 257/315 |
| 2014/0054787 A1* | 2/2014 | Eun | H01L 27/11548 | 257/773 |
| 2014/0061776 A1* | 3/2014 | Kwon | H01L 21/8239 | 257/329 |
| 2015/0061068 A1* | 3/2015 | Akutsu | H01L 21/76877 | 257/499 |
| 2015/0194441 A1* | 7/2015 | Yatsuda | H01L 27/11582 | 438/587 |
| 2015/0200199 A1* | 7/2015 | Sakamoto | G11C 16/0408 | 257/329 |
| 2015/0255484 A1* | 9/2015 | Imamura | H01L 27/11582 | 257/314 |
| 2017/0098659 A1* | 4/2017 | Yoshimizu | H01L 27/11582 | |
| 2017/0141122 A1* | 5/2017 | Yoshimizu | H01L 27/11582 | |
| 2017/0207236 A1* | 7/2017 | Kitamura | H01L 27/11582 | |

* cited by examiner

US 10,002,880 B1

SEMICONDUCTOR DEVICE AND METHOD FOR MANUFACTURING SAME

CROSS-REFERENCE TO RELATED APPLICATION

This application is based upon and claims the benefit of priority from Japanese Patent Application No. 2017-068002, filed on Mar. 30, 2017; the entire contents of which are incorporated herein by reference.

FIELD

Embodiments described herein relate generally to a semiconductor device and a method for manufacturing a semiconductor device.

BACKGROUND

For example, a word line contact region portion in which multiple conductive layers (word lines) are patterned into a staircase configuration has been proposed as a contact structure for connecting the multiple conductive layers to a control circuit in a three-dimensional memory device. An insulating layer is formed on the word line contact region portion; and contact vias pierce the insulating layer and reach the conductive layers of the word line contact region portion. A structure also has been proposed in which air gaps are formed between the multiple conductive layers.

DETAILED DESCRIPTION

Figure 1:
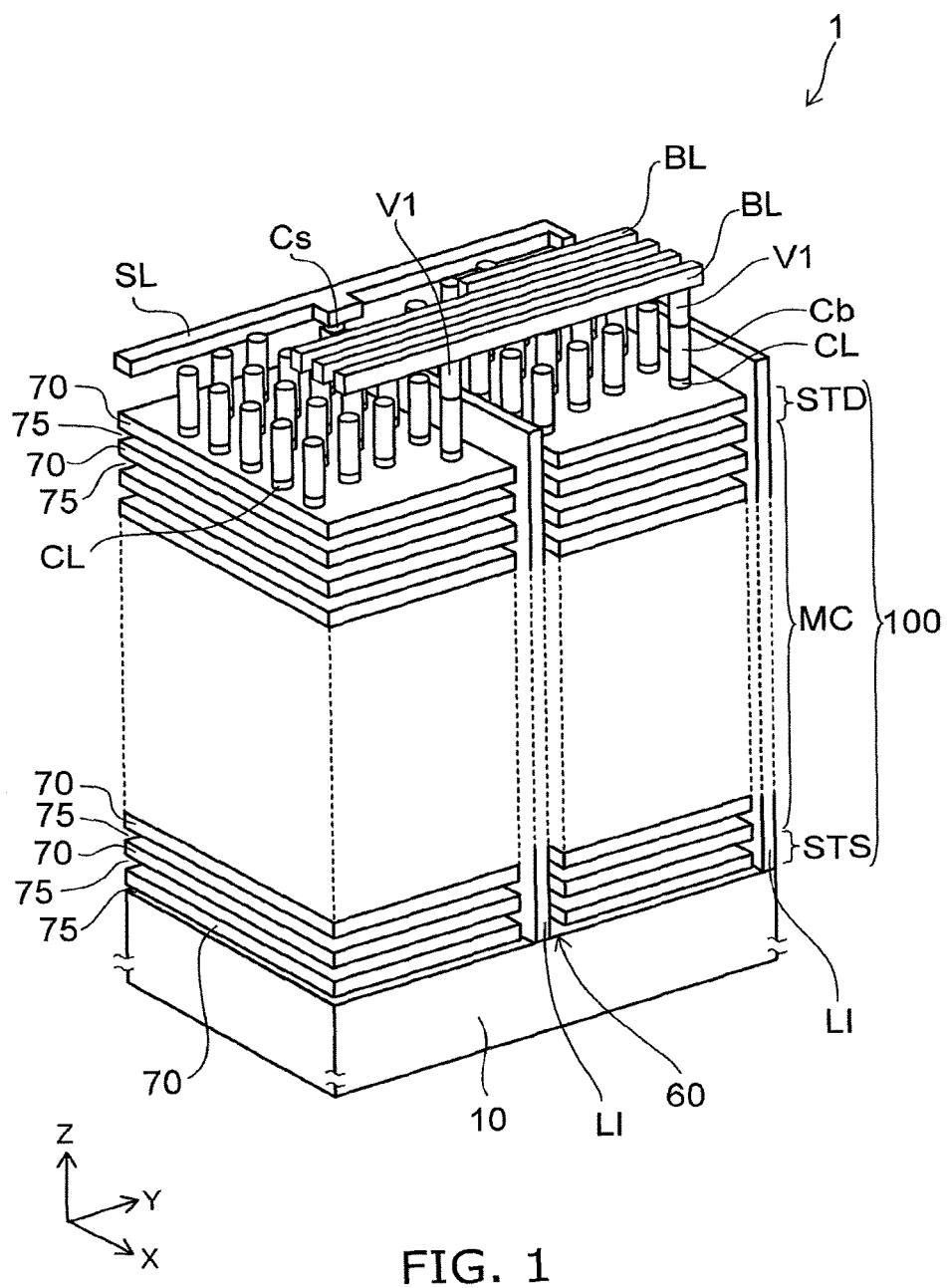
FIG. 1 is a schematic perspective view of a memory cell array of a semiconductor device of an embodiment.

According to one embodiment, a semiconductor device includes a foundation layer, a stacked body, a semiconductor body, a charge storage portion, an insulating layer, a first cover film, a first separation portion, and a third cover film. The stacked body is provided above the foundation layer. The stacked body includes a plurality of conductive layers stacked with an air gap interposed. The stacked body includes a word line contact region portion provided at an end portion in a first direction of the stacked body. The semiconductor body extends through the stacked body in a stacking direction of the stacked body. The charge storage portion is provided between the semiconductor body and one of the conductive layers. The insulating layer is provided above the word line contact region portion. An upper surface of the insulating layer is at a height higher than an uppermost conductive layer of the conductive layers. The first cover film is provided between the word line contact region portion and the insulating layer. The first cover film is of a material different from a material of the insulating layer. The first separation portion divides the insulating layer and the word line contact region portion in a second direction crossing the first direction. The first separation portion includes a second cover film of a material different from the material of the insulating layer. The second cover film covers a side surface along the first direction of the insulating layer and a side surface along the first direction of the word line contact region portion. The third cover film is provided on the uppermost conductive layer. The third cover film covers a side surface along the second direction of the insulating layer. The third cover film is of a material different from the material of the insulating layer.

An embodiment will now be described with reference to the drawings. The same components in the drawings are marked with the same reference numerals.

In the embodiment, for example, a semiconductor memory device including a memory cell array having a three-dimensional structure is described as a semiconductor device.

FIG. 1 is a schematic perspective view of the memory cell array 1 of the embodiment.

Figure 2:
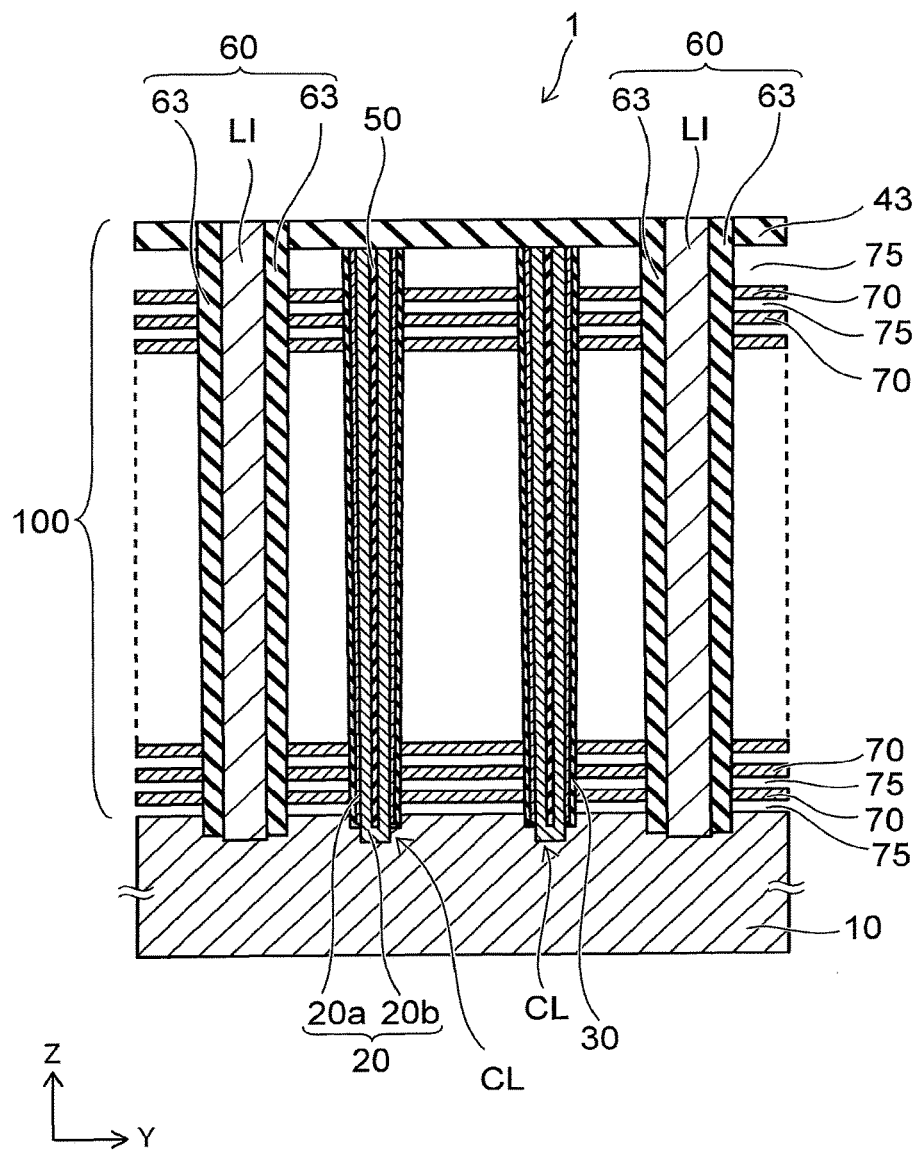
FIG. 2 is a schematic cross-sectional view of the memory cell array of the embodiment.

FIG. 2 is a schematic cross-sectional view of the memory cell array 1.

In FIG. 1, two mutually-orthogonal directions parallel to a major surface of a substrate 10 are taken as an X-direction and a Y-direction; and a direction orthogonal to both the X-direction and the Y-direction is taken as a Z-direction (the stacking direction). The X-direction, the Y-direction, and the Z-direction shown in the other drawings correspond respectively to the X-direction, the Y-direction, and the Z-direction of FIG. 1.

The memory cell array 1 includes the substrate 10 as a foundation layer, a stacked body 100 stacked on the substrate 10, multiple columnar portions CL, and multiple separation portions (second separation portions) 60. For example, bit lines BL and a source line SL are provided as upper layer interconnects above the stacked body 100.

The columnar portions CL are formed in substantially circular columnar configurations extending through the stacked body 100 in the stacking direction (the Z-direction). The separation portions 60 spread in the X-direction and the stacking direction of the stacked body 100 (the Z-direction) and divide the stacked body 100 into multiple blocks (or fingers) in the Y-direction.

The multiple columnar portions CL have, for example, a staggered arrangement. Or, the multiple columnar portions CL may have a square lattice arrangement along the X-direction and the Y-direction.

The multiple bit lines BL are, for example, metal films extending in the Y-direction. The multiple bit lines BL are separated from each other in the X-direction. The upper ends of the semiconductor bodies 20 of the columnar portions CL described below are connected to the bit lines BL via contacts Cb and contacts V1 shown in FIG. 1.

As shown in FIG. 2, the stacked body 100 includes multiple conductive layers (word lines) 70 stacked above the substrate 10. The multiple conductive layers 70 are stacked in a direction (the Z-direction) perpendicular to the major surface of the substrate 10 with gaps (air gaps) 75 interposed. The conductive layers 70 are, for example, layers including a metal or silicon doped with an impurity as a major component. The gap 75 may be provided also between the major surface of the substrate 10 and the lowermost conductive layer 70.

The multiple conductive layers 70 that are stacked with the gaps 75 interposed contact the side surfaces of the columnar portions CL to surround the side surfaces of the multiple columnar portions CL. The multiple conductive layers 70 are supported by such a physical bond with the multiple columnar portions CL; and the gaps 75 between the conductive layers 70 are maintained.

An insulative cover film (a fourth cover film) 43 is provided on the uppermost conductive layer 70 with the gap 75 interposed. The cover film 43 covers the upper ends of the columnar portions CL. The cover film 43 is, for example, a silicon nitride film.

Figure 3:
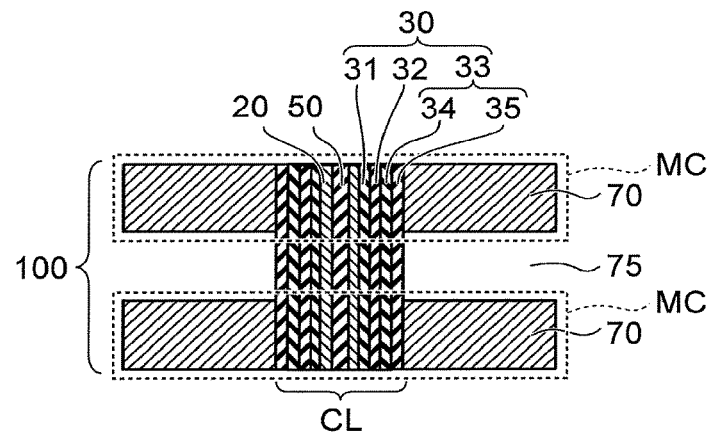
FIG. 3 is an enlarged view of one portion of FIG. 2.

FIG. 3 is an enlarged view of one portion of FIG. 2.

The columnar portion CL includes a memory film 30, the semiconductor body 20, and an insulative core film 50. The semiconductor body 20, the memory film 30, and the core film 50 extend to be continuous along the stacking direction of the stacked body 100.

The semiconductor body 20 extends in a pipe-like configuration through the stacked body 100 in the stacking direction (the Z-direction). The memory film 30 is provided between the semiconductor body 20 and the conductive layer 70, and surrounds the semiconductor body 20 from the outer perimeter side. The core film 50 is provided on the inner side of the semiconductor body 20 having a pipe-like configuration.

The memory film 30 is a stacked film of insulating films including a tunneling insulating film 31, a charge storage film (a charge storage portion) 32, and a blocking insulating film 33.

The tunneling insulating film 31 is provided between the semiconductor body 20 and the charge storage film 32. The charge storage film 32 is provided between the tunneling insulating film 31 and the blocking insulating film 33. The blocking insulating film 33 is provided between the charge storage film 32 and the conductive layers 70.

The semiconductor body 20, the memory film 30, and the conductive layer 70 are included in a memory cell MC. The memory cell MC has a vertical transistor structure in which the conductive layer 70 surrounds the periphery of the semiconductor body 20 with the memory film 30 interposed.

In the memory cell MC having the vertical transistor structure, the semiconductor body 20 is, for example, a channel body of silicon; and the conductive layer 70 functions as a control gate. The charge storage film 32 functions as a data storage layer that stores charge injected from the semiconductor body 20.

The semiconductor memory device of the embodiment is a nonvolatile semiconductor memory device that can freely and electrically erase/program data and can retain the memory content even when the power supply is OFF.

The memory cell MC is, for example, a charge trap memory cell. The charge storage film 32 has many trap sites that trap charge inside an insulative film and includes, for example, a silicon nitride film. Or, the charge storage film 32 may be a conductive floating gate surrounded with an insulating body.

The tunneling insulating film 31 is used as a potential barrier when the charge is injected from the semiconductor body 20 into the charge storage film 32 or when the charge stored in the charge storage film 32 is discharged into the semiconductor body 20. The tunneling insulating film 31 includes, for example, a silicon oxide film.

The blocking insulating film 33 prevents the charge stored in the charge storage film 32 from being discharged into the conductive layer 70. Also, the blocking insulating film 33 prevents back-tunneling of the charge from the conductive layer 70 into the columnar portion CL.

The blocking insulating film 33 includes a first blocking film 34 and a second blocking film 35. The first blocking film 34 is provided between the charge storage film 32 and the second blocking film 35 and is, for example, a silicon oxide film. The second blocking film 35 is provided between the first blocking film 34 and the conductive layer 70 and is, for example, an aluminum oxide film.

As shown in FIG. 1, a drain-side selection transistor STD is provided in the upper layer portion of the stacked body 100. A source-side selection transistor STS is provided in the lower layer portion of the stacked body 100. At least the uppermost conductive layer 70 functions as a control gate of the drain-side selection transistor STD. At least the lowermost conductive layer 70 functions as a control gate of the source-side selection transistor STS.

The multiple memory cells MC are provided between the drain-side selection transistor STD and the source-side selection transistor STS. The multiple memory cells MC, the drain-side selection transistor STD, and the source-side selection transistor STS are connected in series via the semiconductor body 20 and are included in one memory string. For example, the memory strings have a staggered arrangement in a planar direction parallel to the X-Y plane; and the multiple memory cells MC are provided three-dimensionally in the X-direction, the Y-direction, and the Z-direction.

As shown in FIG. 2, the separation portion 60 includes an interconnect portion LI and an insulating film 63. The interconnect portion LI spreads in the X-direction and the Z-direction and is, for example, a film including a metal. The insulating film 63 is provided on the side surface of the interconnect portion LI. The insulating film 63 is provided between the stacked body 100 and the interconnect portion LI.

The lower end portion of the interconnect portion LI contacts the substrate 10. The lower end portion of the semiconductor body 20 also contacts the substrate 10. The substrate 10 is, for example, a silicon substrate doped with an impurity.

The word line contact region portion will now be described. The word line contact region portion is provided at the end portion in the X-direction of the stacked body 100. A staircase-shaped stacked portion 2 is described as an example of the word line contact region portion in the embodiments recited below.

Figure 4:
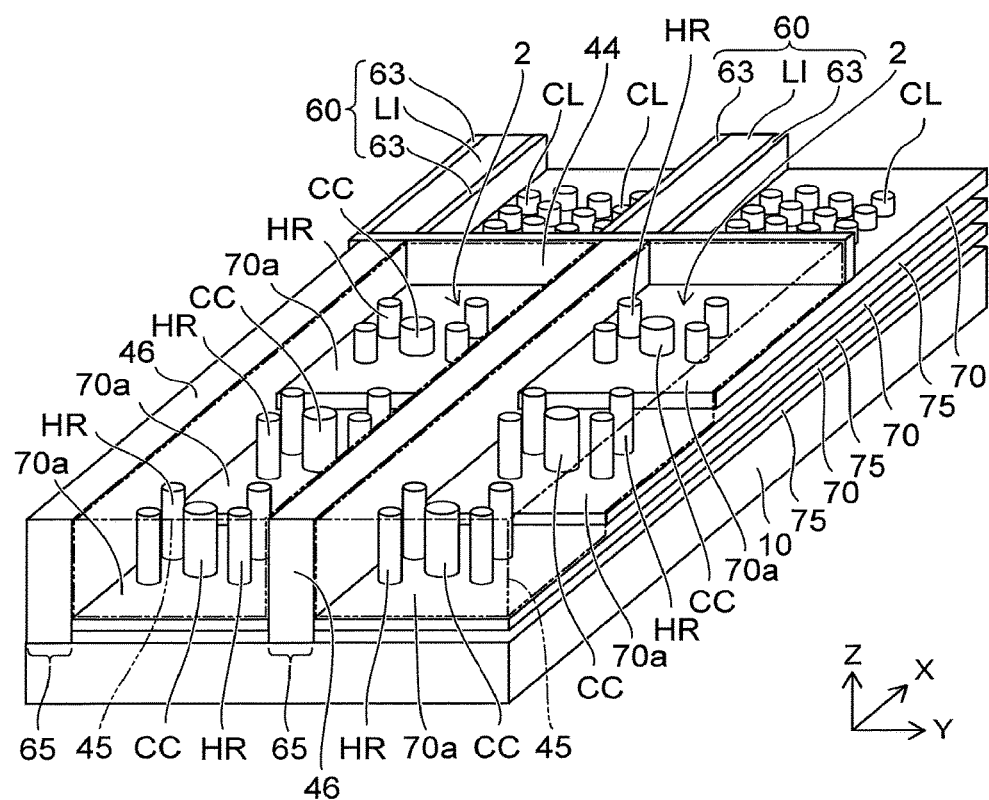
FIG. 4 is a schematic perspective view of a staircase-shaped stacked portion of the semiconductor device of the embodiment.

FIG. 4 is a schematic perspective view of the staircase-shaped stacked portion 2 of the embodiment.

Figure 5A:
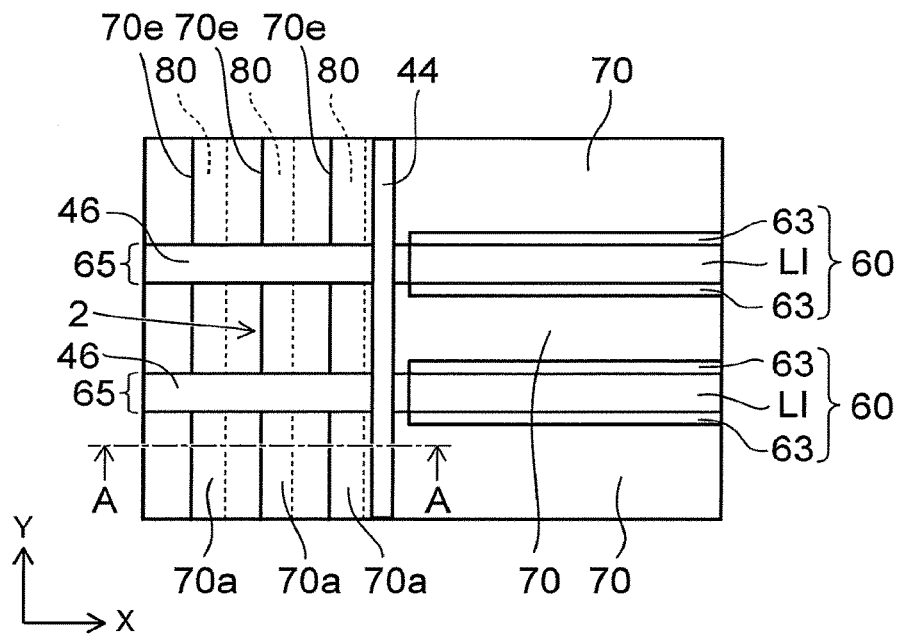
FIGS. 5A and 5B are schematic plan view of the staircase-shaped stacked portion of the embodiment.

FIG. 5A is a schematic plan view of the staircase-shaped stacked portion 2.

Figure 6:
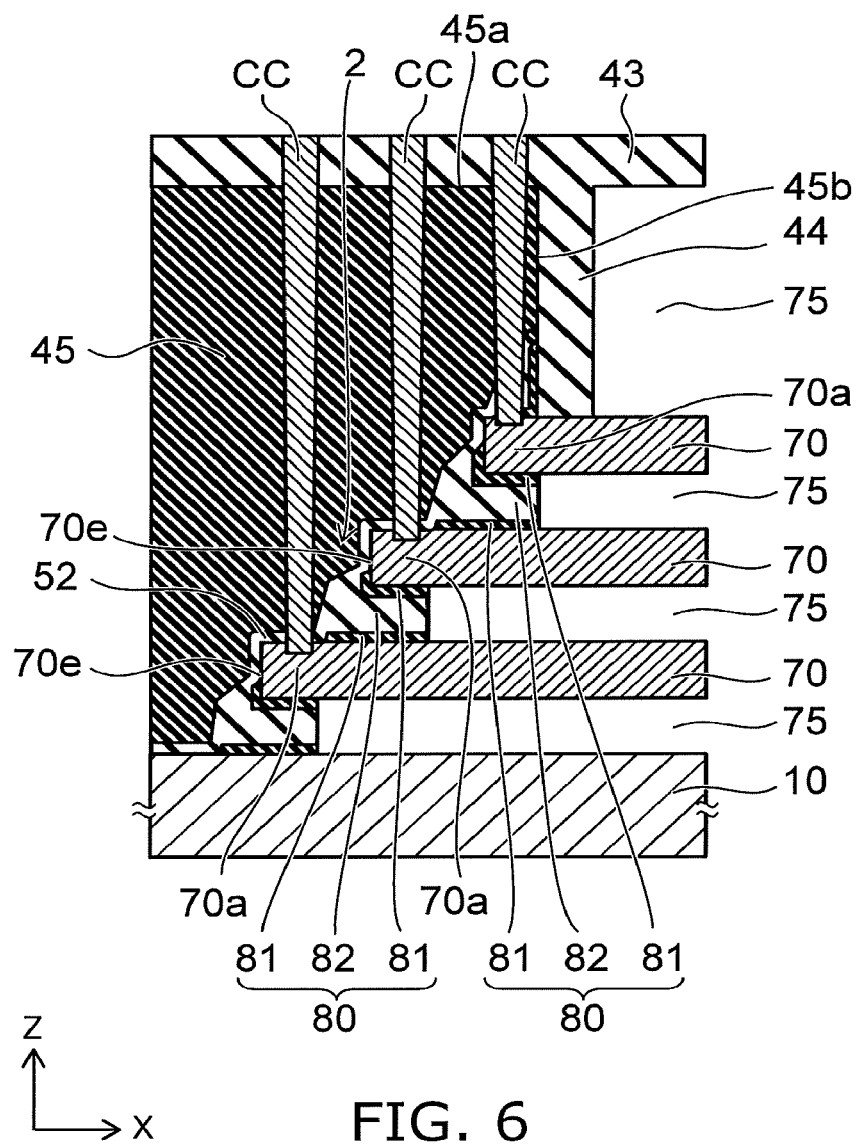
FIG. 6 is a schematic cross-sectional view of the staircase-shaped stacked portion of the embodiment.

FIG. 6 is a schematic cross-sectional view of the staircase-shaped stacked portion 2 and corresponds to an A-A cross section of FIG. 5A.

In FIG. 4 to FIG. 6, there are three layers of the conductive layers 70 above the substrate 10 to simplify the illustration.

The cover film 43, an insulating layer 45, a cover film 52, and contact vias CC shown in FIG. 6 are not illustrated in FIG. 5A.

The cover film 43, the cover film 52, and spacers 80 shown in FIG. 6 are not illustrated in FIG. 4. The insulating layer 45 is illustrated by a double dot-dash line in FIG. 4.

The substrate 10 and the multiple conductive layers 70 stacked with the gaps 75 interposed extend in the X-direction from a region including the memory cell array 1 to a periphery region arranged outer the region including the memory cell array 1. The staircase-shaped stacked portion 2, in which the multiple conductive layers 70 are arranged in a staircase configuration by forming level differences in the X-direction, is provided in the periphery region.

The multiple conductive layers 70 of the staircase-shaped stacked portion 2 include multiple tip portions (terrace portions) 70a arranged in a staircase configuration in the X-direction. For each of the conductive layers 70, another of the conductive layers 70 does not overlap the upper surface of the tip portion 70a from above.

As shown in FIG. 6, the insulating layer 45 is provided above the staircase-shaped stacked portion 2. The cover film (the first cover film) 52 is provided between the insulating layer 45 and the staircase-shaped stacked portion 2. The cover film 52 covers the surfaces of the tip portions 70a of the conductive layers 70.

The spacer 80 is provided between the tip portion 70a of the conductive layer 70 and another conductive layer 70 directly under the tip portion 70a. The gap 75 extends in the X-direction from the region including the memory cell array 1 to the tip portion 70a vicinity of the conductive layer 70; and the spacer 80 is provided to plug the gap 75.

The cover film 52 and the spacer 80 are provided between the insulating layer 45 and the gap 75; and the insulating layer 45 is not exposed in the gap 75.

The spacer 80 includes a first insulating film 81 as a first insulator, and a second insulating film 82 as a second insulator. A pair of first insulating films 81 is separated (or kept away) in the height direction of the gap 75. The second insulating film 82 is provided between the pair of first insulating films 81.

The first insulating film 81 on the upper side of one spacer 80 is formed on the lower surface of the tip portion 70a of the conductive layer 70 on the spacer 80; and the first insulating film 81 on the lower side of the one spacer 80 is formed on the upper surface of the conductive layer 70 under the spacer 80.

The bandgap of the second insulating film 82 is narrower than the bandgap of the first insulating film 81; and the spacer 80 is an insulating film having a trapping property of electrons.

For example, the first insulating film 81 is a silicon oxide film (a $SiO_2$ film) or a carbon-doped silicon oxide film (a SiCO film). The second insulating film 82 is a silicon nitride film (a SiN film), an aluminum oxide film (an AlO film), a hafnium oxide film (a HfO film), a hafnium silicate film (a HfSiO film), or a zirconium oxide film (a ZrO film).

For the same conductive layer 70, the first insulating film 81 that is provided on the upper surface of the conductive layer 70 and the first insulating film 81 that is provided on the lower surface of the conductive layer 70 are separated from each other. The cover film 52 contacts the upper surface and an end surface 70e of the tip portion 70a of the conductive layer at the portion where the first insulating films 81 are separated. The cover film 52 is provided between the insulating layer 45 and the first insulating films 81.

On the side of the spacer 80 adjacent to the gap 75 as well, the pair of first insulating films 81 that has the second insulating film 82 interposed is separated and is not linked to each other.

As shown in FIG. 4 and FIG. 5A, the staircase-shaped stacked portion 2 is divided into multiple blocks (or fingers) in the Y-direction by a separation portion (a first separation portion) 65. The separation portion 65 is connected to the separation portion 60 dividing the memory cell array 1, and extends along an extension line of the separation portion 60. The separation portion 60 and the separation portion 65 extend in the X-direction continuously without interruption, and divide the multiple conductive layers 70 into multiple blocks (or fingers) in the Y-direction in the staircase-shaped stacked portion 2 as well.

The separation portion 65 also divides the insulating layer 45 (illustrated by the double dot-dash line in FIG. 4) in the Y-direction.

The separation portion 65 includes a cover film (a second cover film) 46. The cover film 46 covers the side surface along the X-direction of the insulating layer 45 and the side surface along the X-direction of the staircase-shaped stacked portion 2.

As shown in FIG. 6, an upper surface 45a of the insulating layer 45 is positioned at a height that is higher than the uppermost conductive layer 70. The cover film (the fourth cover film) 43 is provided on the upper surface 45a of the insulating layer 45. The cover film 43 is provided also in the memory cell array 1 as shown in FIG. 2, and covers the upper ends of the columnar portions CL.

A cover film (a third cover film) 44 that covers a side surface 45b along the Y-direction of the insulating layer 45 is provided on the uppermost conductive layer 70. As shown in FIG. 4 and FIG. 5A, the cover film 44 extends in the Y-direction, and is formed between the staircase-shaped stacked portion 2 and the stacked portion (the memory cell array 1) where the multiple columnar portions CL are disposed.

The insulating layer 45 is covered with the cover film 52, the cover film 46, the cover film 44, and the cover film 43. The insulating layer 45 is, for example, a silicon oxide layer. The cover film 52, the cover film 46, the cover film 44, and the cover film 43 are insulating films of materials different from that of the insulating layer 45. The cover film 52, the cover film 46, the cover film 44, and the cover film 43 are, for example, silicon nitride films having etching resistance (etching selectivity) to the etching conditions of the silicon oxide layer.

As shown in FIG. 4 and FIG. 6, the multiple contact vias CC that extend in the Z-direction are provided inside the insulating layer 45. The multiple contact vias CC pierce the cover film 43, the insulating layer 45, and the cover film 52. The lower end portions of the multiple contact vias CC respectively contact the corresponding tip portions 70a of the multiple conductive layers 70.

The contact vias CC are conductive bodies including a metal; and each of the contact vias CC are connected respectively to not-illustrated upper layer interconnects. For example, the upper layer interconnects are electrically connected to a control circuit formed in the surface of the substrate 10. The potentials of the conductive layers 70 of each layer of the memory cell array 1 are controlled using the contact vias CC.

As shown in FIG. 4, multiple columnar portions HR are disposed in the staircase-shaped stacked portion 2. The columnar portions HR pierce the insulating layer 45, the cover film 52, and the staircase-shaped stacked portion 2 and reach the substrate 10.

In the example shown in FIG. 4, one contact via CC and four columnar portions HR at the periphery of the contact via CC are disposed at one tip portion 70a.

The multiple conductive layers 70 of the staircase-shaped stacked portion 2 contact the side surfaces of the multiple columnar portions HR to surround the side surfaces. The multiple conductive layers 70 of the staircase-shaped stacked portion 2 are supported by such a physical bond with the multiple columnar portions HR; and the gaps 75 are maintained between the multiple conductive layers 70 of the staircase-shaped stacked portion 2.

The columnar portions HR may be formed simultaneously when forming the columnar portions CL of the memory cell array 1. In such a case, the columnar portions HR may be formed as stacked films having the same configuration as the columnar portions CL. Or, the columnar portions HR may be pillars of an insulating material formed in a separate process from the columnar portions CL.

It is desirable to increase the number of stacks of the conductive layers 70 to increase the density of the memory cells MC. On the other hand, from the perspective of easily patterning the stacked body 100, it is desirable to suppress the increase of the thickness of the entire stacked body 100. Therefore, it is also desirable to reduce the spacing of the conductive layers 70 adjacent to each other in the stacking direction as the number of stacks of the conductive layers 70 is increased. Such a reduction of the space between the conductive layers 70 may easily cause dielectric breakdown between the conductive layers 70 or interference (fluctuation of the threshold voltage, etc.) between the memory cells MC caused by capacitive coupling between the conductive layers 70.

According to the embodiment as shown in FIG. 2 and FIG. 3, the gap 75 is formed between the conductive layers 70 of the memory cells MC adjacent to each other in the stacking direction. Therefore, the breakdown voltage between the adjacent conductive layers 70 can be increased. Further, the capacitance between the adjacent conductive layers 70 can be reduced; and the interference between the adjacent memory cells MC can be suppressed.

As shown in FIG. 6, the gap is not formed under the entire tip portion 70a of the conductive layer 70 of the staircase-shaped stacked portion 2; and the tip portion 70a is supported by the spacer 80. Such a structure increases the mechanical strength of the staircase-shaped stacked portion 2.

As described above, the spacer 80 is a stacked film of the insulating films 81 and 82 having different bandgaps, and has a trapping property of electrons. The electrons that tunnel through the first insulating film 81 are trapped in the second insulating film 82; and the electric field between the conductive layers 70 adjacent to each other above and below can be relaxed by the trapped electrons. Such a spacer 80 has higher resistance to dielectric breakdown between the mutually-adjacent conductive layers 70 than an insulating film of a single material.

A method for manufacturing the semiconductor device of the embodiment will now be described.

First, the processes for the stacked body 100 in the region where the memory cell array 1 is formed will be described with reference to FIG. 7 to FIG. 15. FIG. 7 to FIG. 15 correspond to the cross section of FIG. 2.

Figure 7:
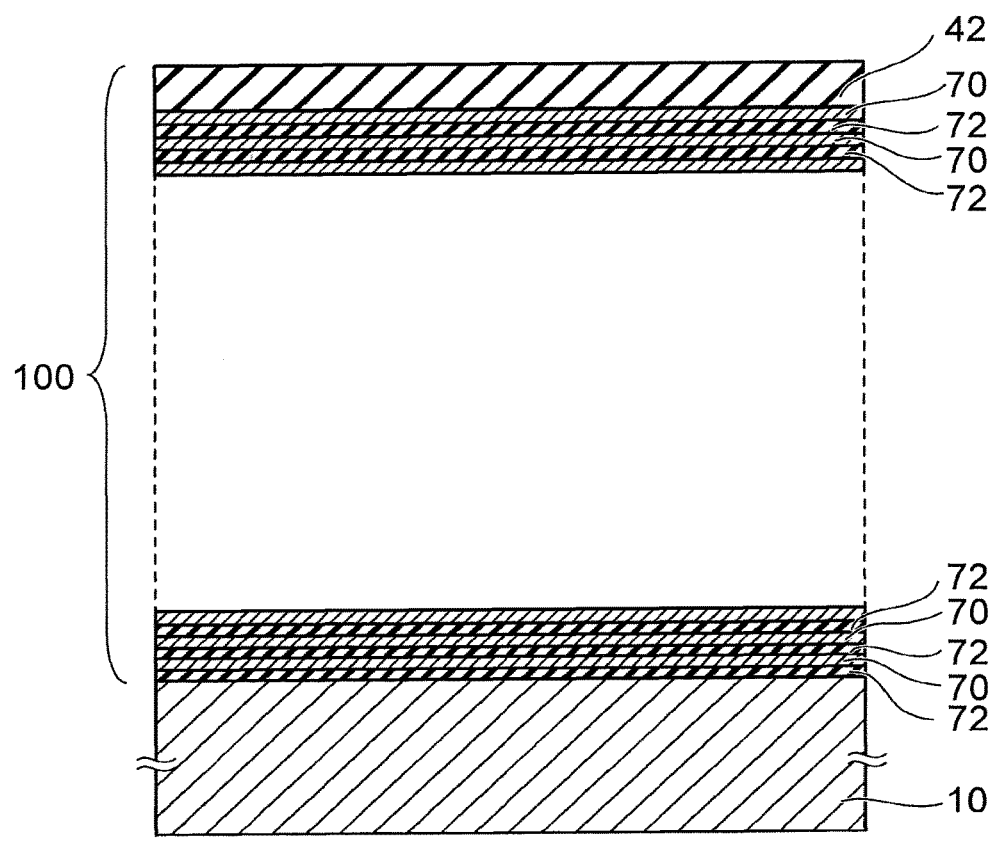
FIG. 7 to FIG. 20B are schematic cross-sectional views showing a method for manufacturing the semiconductor device of the embodiment.

As shown in FIG. 7, the stacked body 100 is formed on the substrate 10. An insulating layer or a sacrificial layer 72 as a second layer and the conductive layer 70 as a first layer are stacked alternately on the substrate 10. The process of alternately stacking the insulating layer 72 and the conductive layer 70 is repeated; and the multiple insulating layers 72 and the multiple conductive layers 70 are formed on the substrate 10. An insulating layer 42 is formed on the uppermost conductive layer 70. The insulating layer 72 and the insulating layer 42 are, for example, silicon oxide layers.

Figure 8:
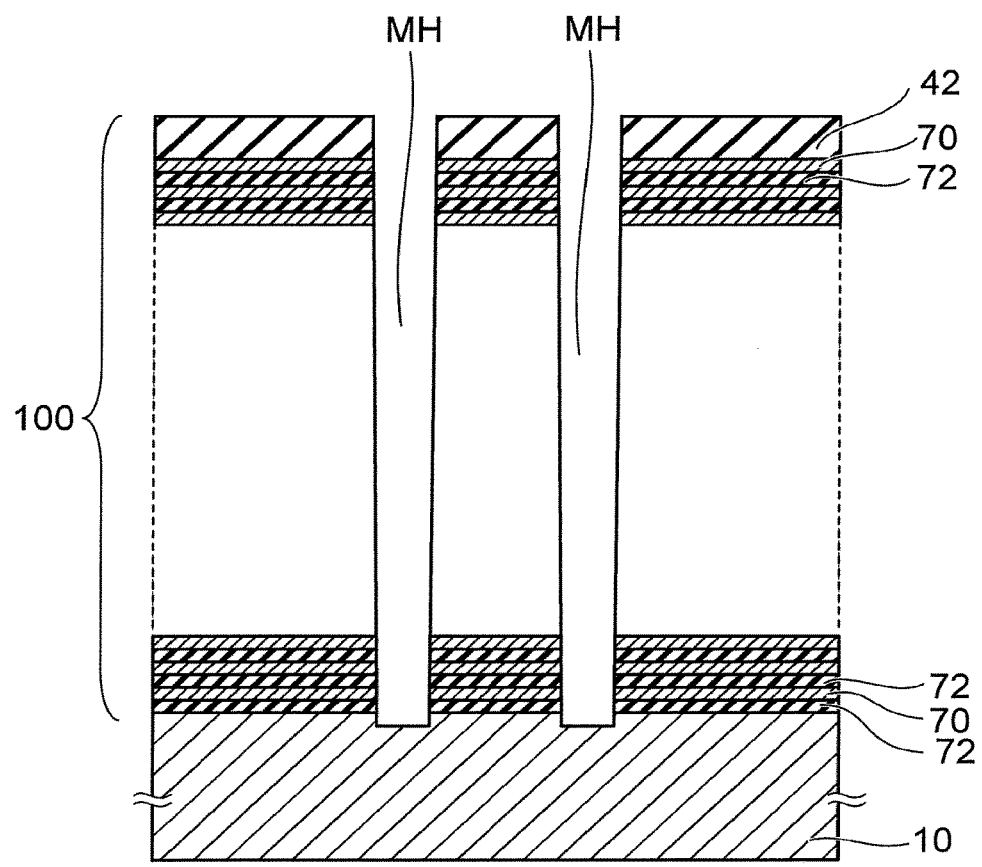

Then, as shown in FIG. 8, multiple memory holes MH are formed in the stacked body 100. The memory holes MH are formed by reactive ion etching (RIE) using a not-illustrated mask. The memory holes MH pierce the stacked body 100 and reach the substrate 10.

Figure 9:
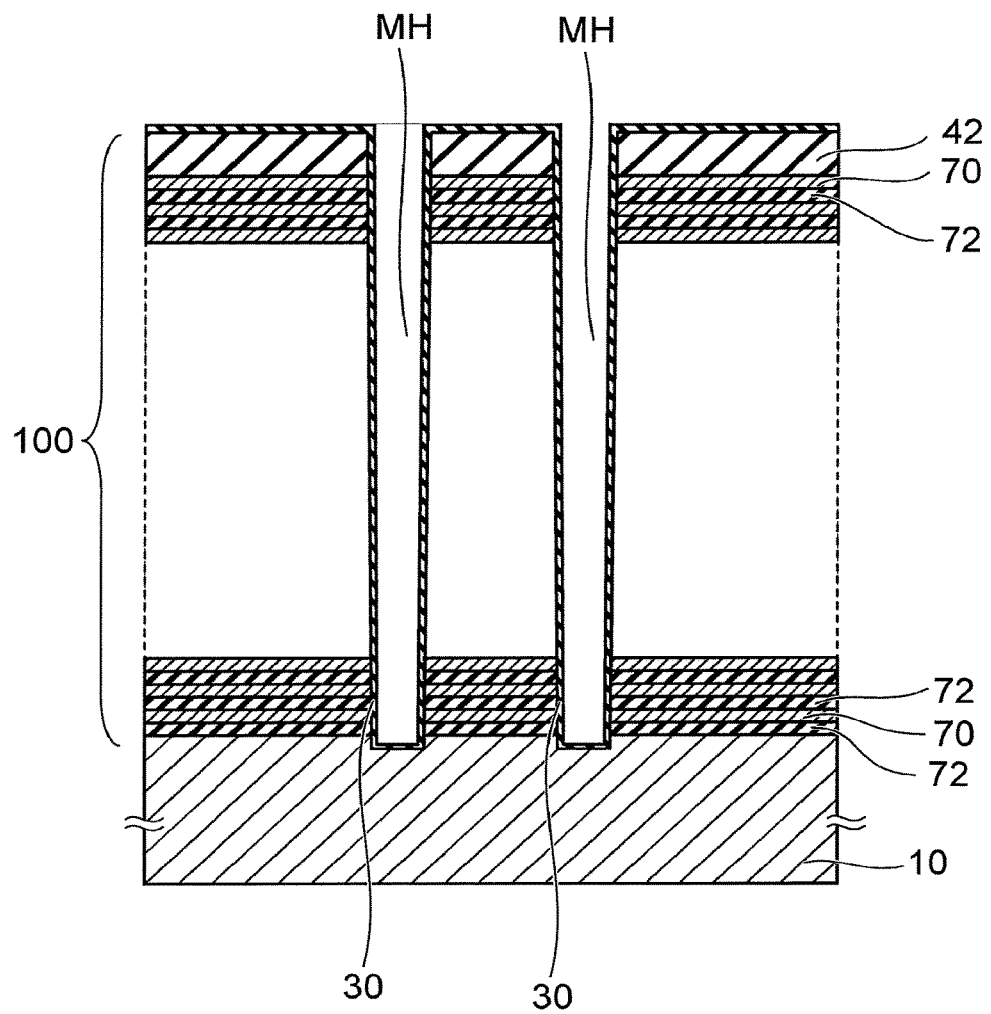

As shown in FIG. 9, the memory film 30 is formed inside the memory holes MH. The memory film 30 is formed conformally along the side surfaces and bottoms of the memory holes MH.

Figure 10:
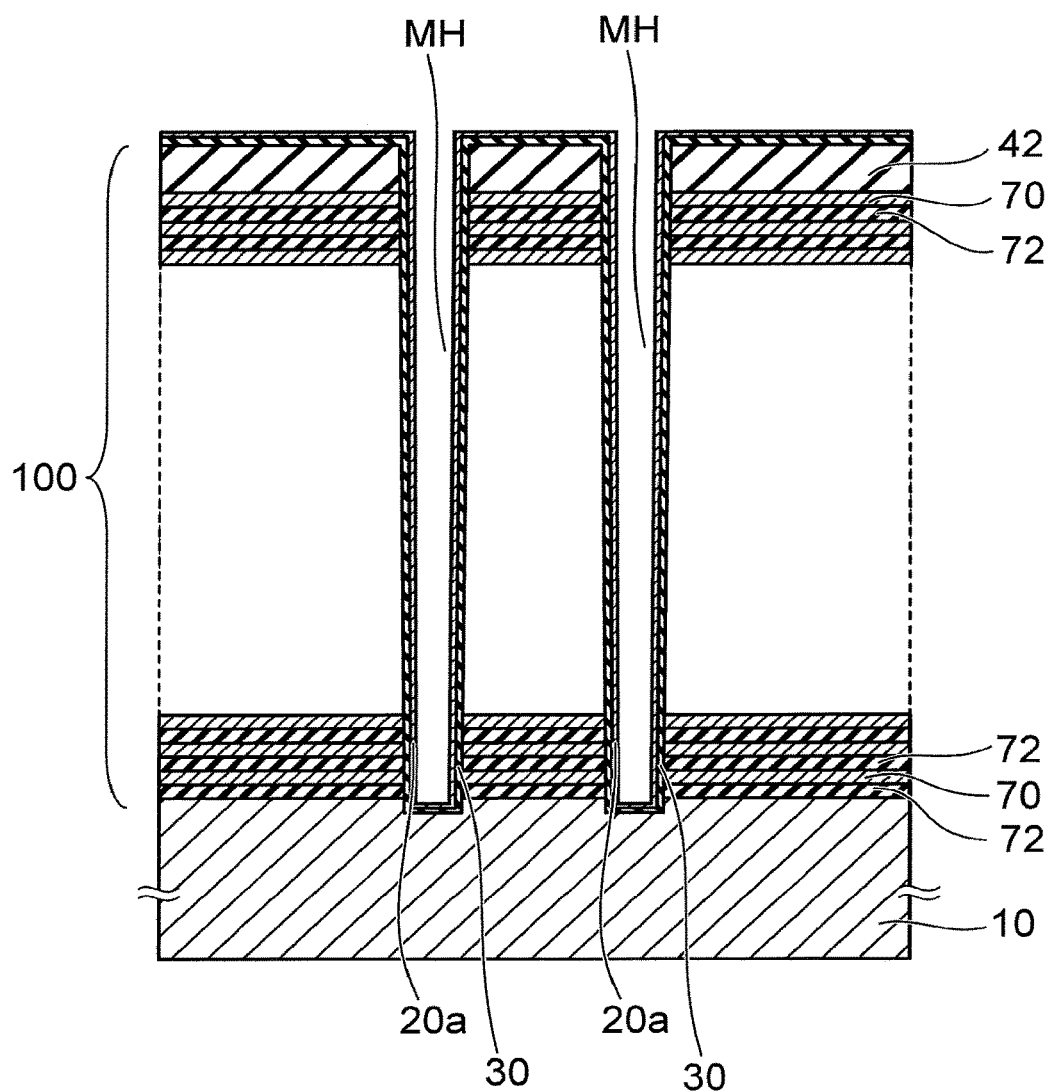

As shown in FIG. 10, a cover film 20a is formed on the inner side of the memory film 30. The cover film 20a is formed conformally along the side surfaces and bottoms of the memory holes MH.

Figure 11:
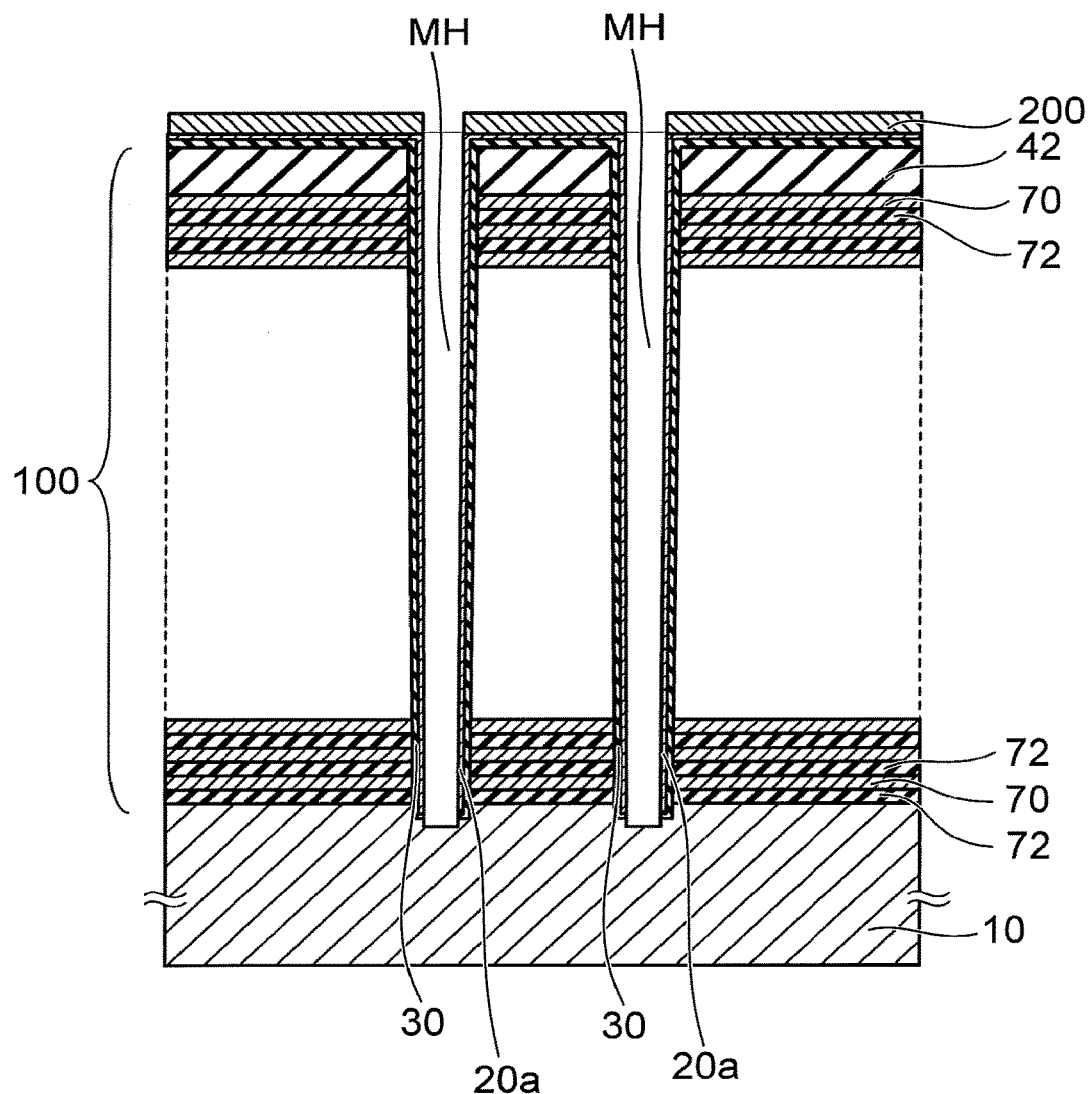

Then, as shown in FIG. 11, a mask layer 200 is formed on the upper surface of the stacked body 100; and the cover film 20a and the memory film 30 that are deposited on the bottoms of the memory holes MH are removed by RIE. In the RIE, the memory film 30 formed on the side surfaces of the memory holes MH is covered with and protected by the cover film 20a and is not damaged by the RIE.

Figure 12:
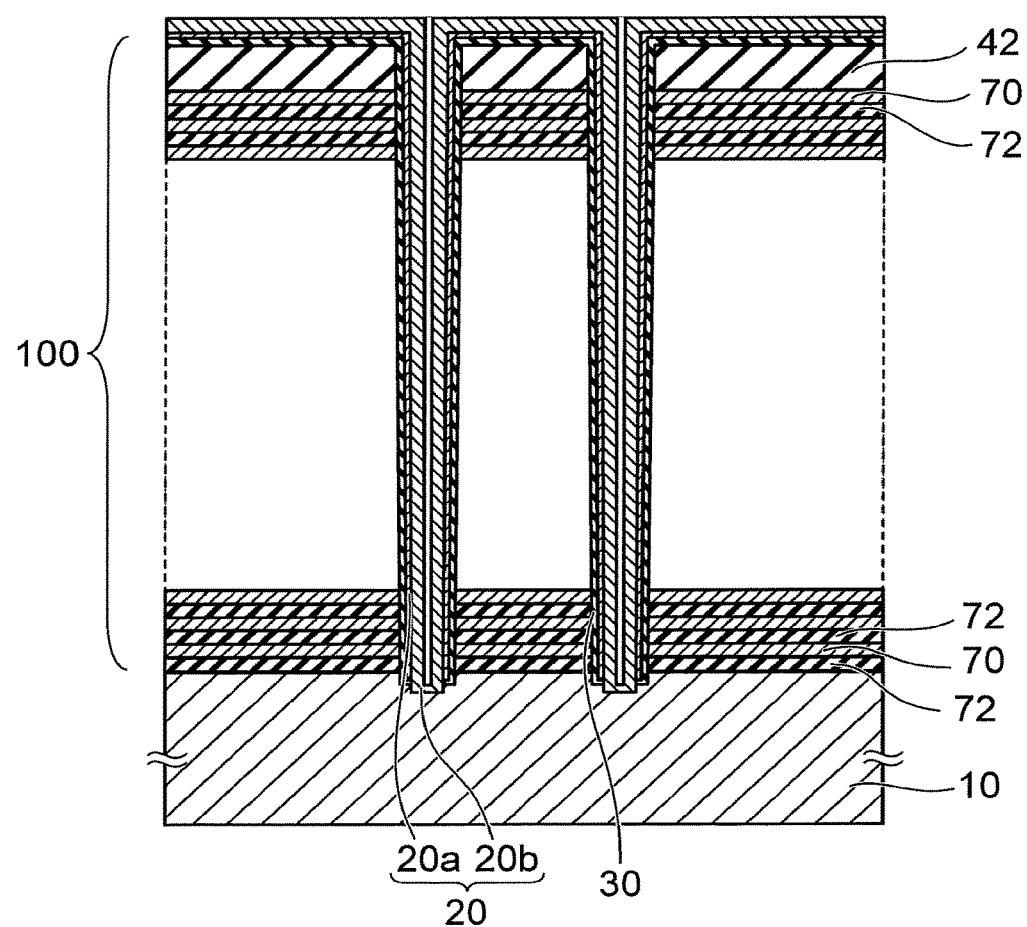

After removing the mask layer 200, a semiconductor film 20b is formed inside the memory holes MH as shown in FIG. 12. The semiconductor film 20b is formed on the side surface of the cover film 20a and on the bottoms of the memory holes MH where the substrate 10 is exposed.

For example, the cover film 20a and the semiconductor film 20b are formed as amorphous silicon films and subsequently are crystallized into polycrystalline silicon films by heat treatment. The cover film 20a and the semiconductor film 20b are included in the semiconductor body 20 described above.

Figure 13:
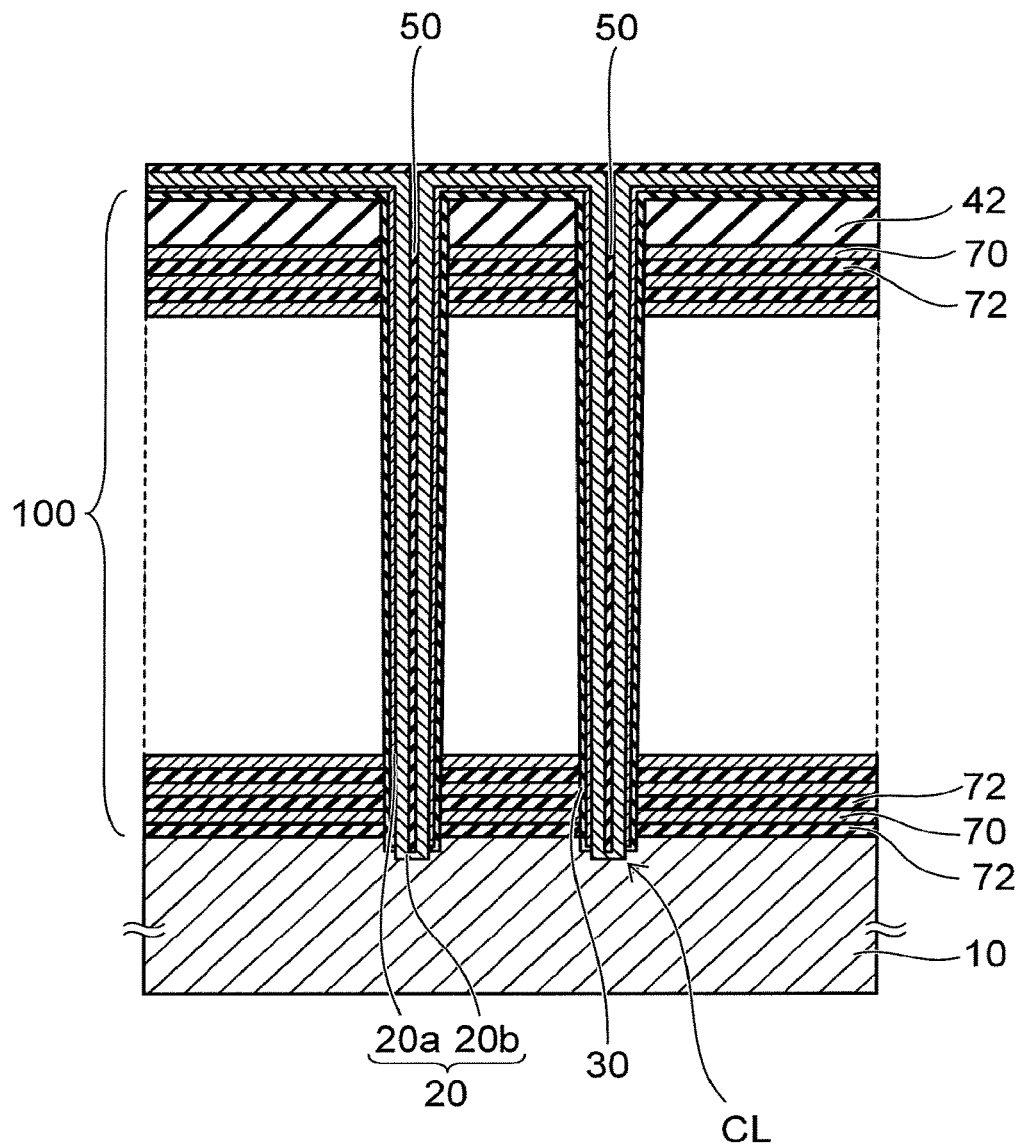

As shown in FIG. 13, the core film 50 is formed on the inner side of the semiconductor film 20b. The multiple columnar portions CL that include the memory film 30, the semiconductor body 20, and the core film 50 are formed inside the stacked body 100.

Figure 14:
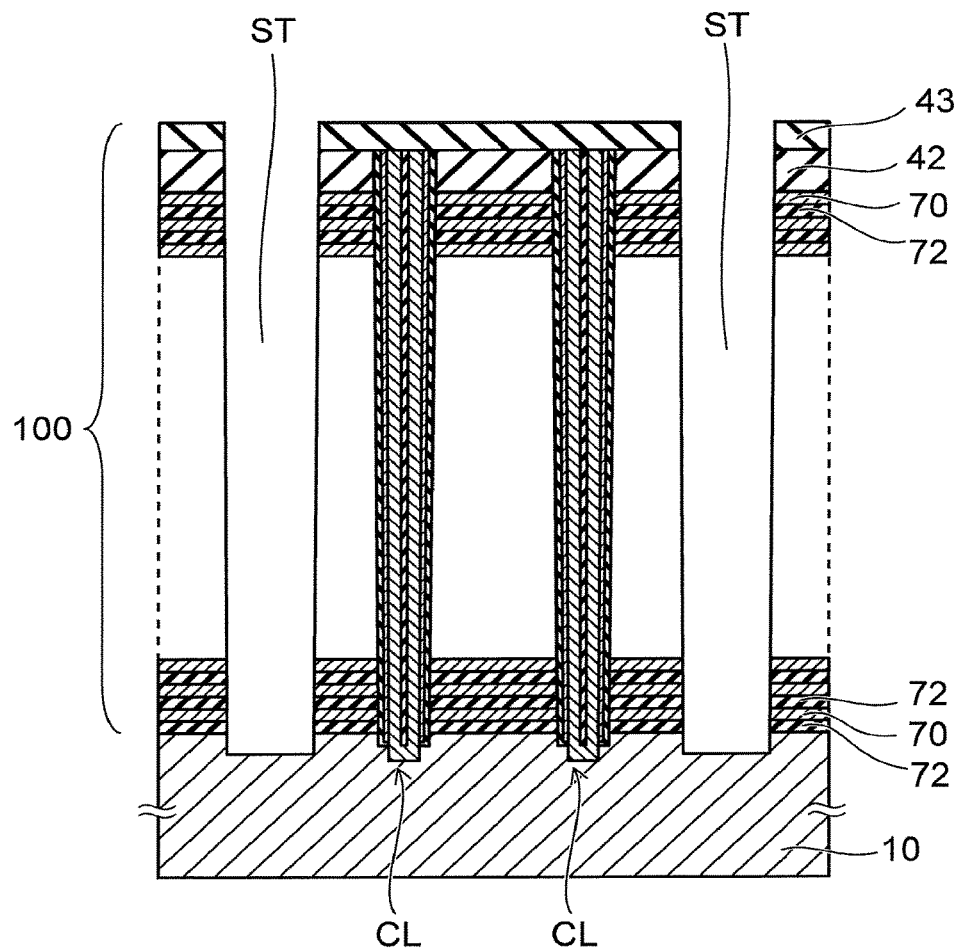

Each of the films deposited on the insulating layer 42 shown in FIG. 13 is removed using chemical mechanical polishing (CMP) or etch-back. Subsequently, as shown in FIG. 14, the cover film 43 is formed on the insulating layer 42. The cover film 43 covers the upper ends of the columnar portions CL.

Then, multiple slits ST are formed in the stacked body 100. By using RIE using a not-illustrated mask, the multiple slits ST are caused to pierce the cover film 43, the insulating layer 42, the multiple conductive layers 70, and the multiple insulating layers 72 to reach the substrate 10.

Continuing, the insulating layers 72 and the insulating layer 42 are removed by an etchant or an etching gas supplied through the slits ST. For example, the insulating layer 42 and the sacrificial layers 72 which are silicon oxide layers are removed using an etchant including hydrofluoric acid.

Figure 15:
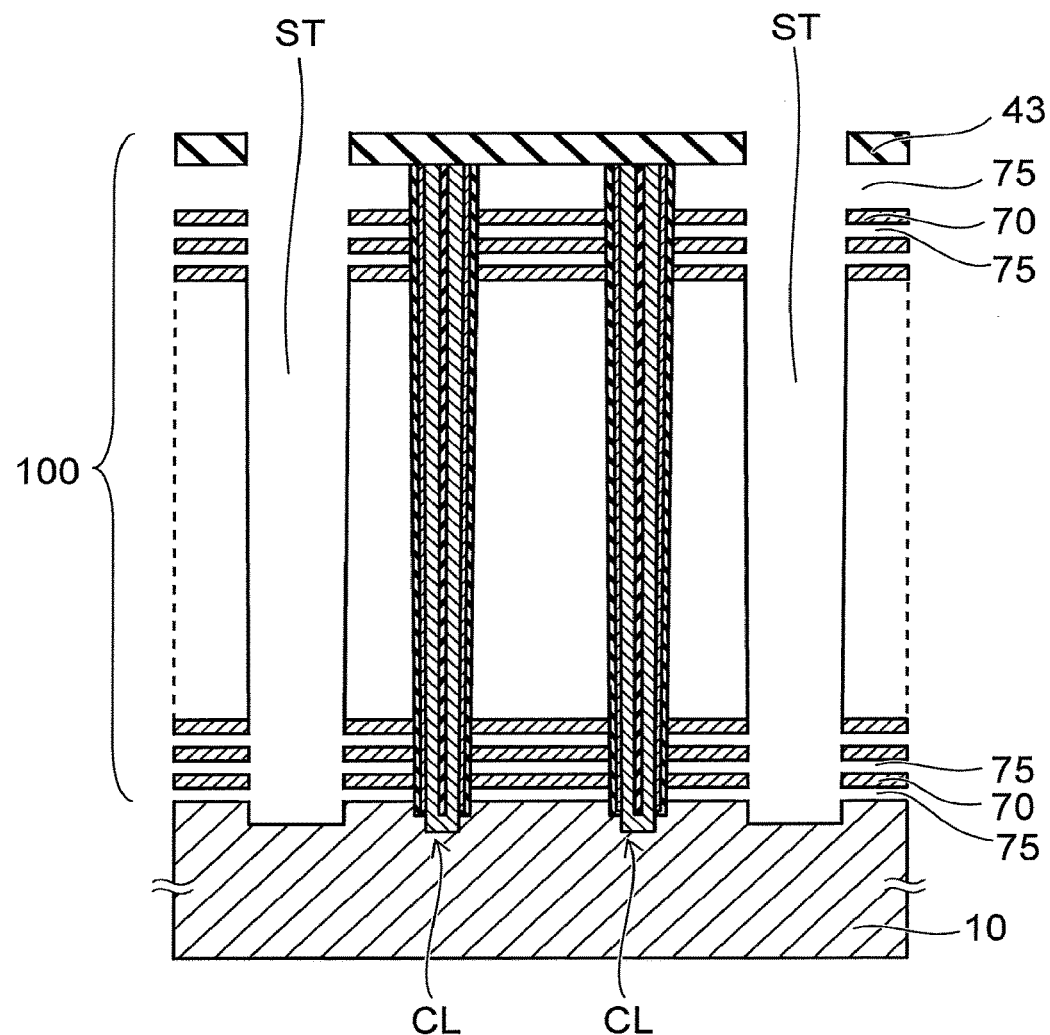

The insulating layers 72 are removed; and the gaps 75 are formed between the conductive layers 70 adjacent to each other above and below as shown in FIG. 15. The gap 75 is formed also between the substrate 10 and the lowermost conductive layer 70. The gap 75 is formed also between the cover film 43 and the uppermost conductive layer 70.

Subsequently, the insulating film 63 shown in FIG. 2 is formed on the side surfaces and bottoms of the slits ST. The insulating film 63 formed on the bottoms of the slits ST is removed by RIE; subsequently, the interconnect portion LI is filled on the inner side of the insulating film 63 inside the slits ST. The lower end portion of the interconnect portion LI contacts the substrate 10. Subsequently, the bit lines BL, the source line SL, etc., shown in FIG. 1 are formed.

The processes for the stacked body 100 in the region where the staircase-shaped stacked portion 2 is formed will now be described with reference to FIG. 16A to FIG. 23B.

FIG. 16A to FIG. 20B correspond to the cross section of FIG. 6.

FIG. 21A to FIG. 23B correspond to the plane of FIG. 5A.

Figure 16A:
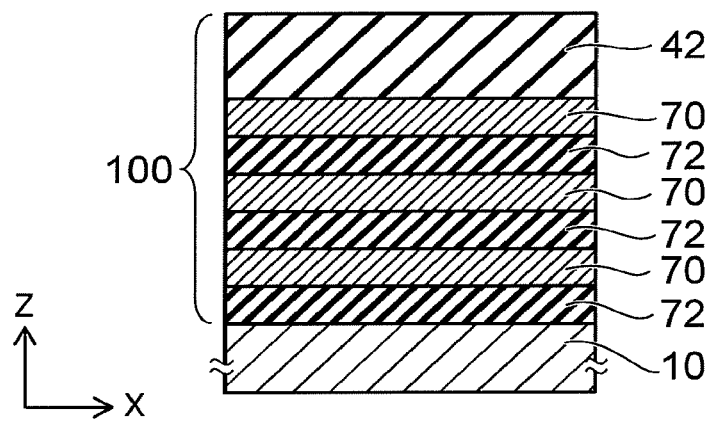

In the region where the staircase-shaped stacked portion 2 is formed as well, the stacked body 100 that includes the multiple insulating layers 72 and the multiple conductive layers 70 is formed on the substrate 10 as shown in FIG. 16A. In the region where the staircase-shaped stacked portion 2 is formed, three layers of the conductive layers 70 are used to simplify the illustration.

Figure 16B:
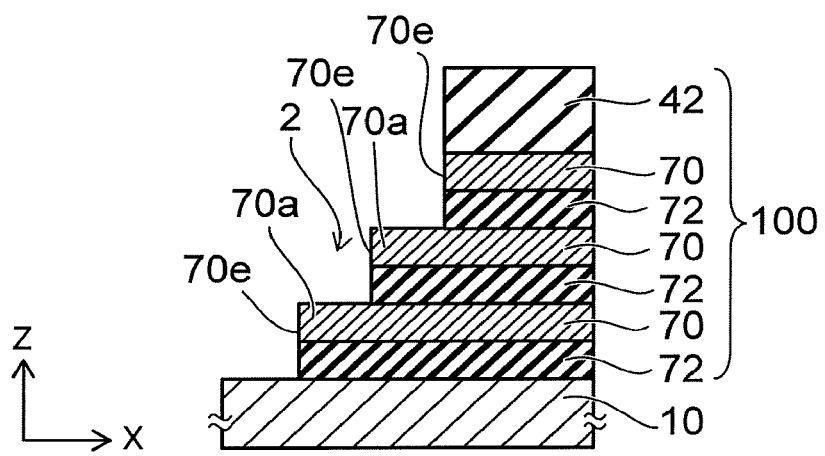

As shown in FIG. 16B, the staircase-shaped stacked portion 2 is formed in a portion of the stacked body 100. For example, the multiple conductive layers 70 and the multiple sacrificial layers 72 are patterned into a staircase configuration along the X-direction by repeating RIE using a not-illustrated resist film as a mask and a reduction (slimming) of the planar size of the resist film. The multiple tip portions (the terrace portions) 70a arranged in the staircase configuration are formed by forming level differences in the X-direction in the multiple conductive layers 70.

Figure 17A:
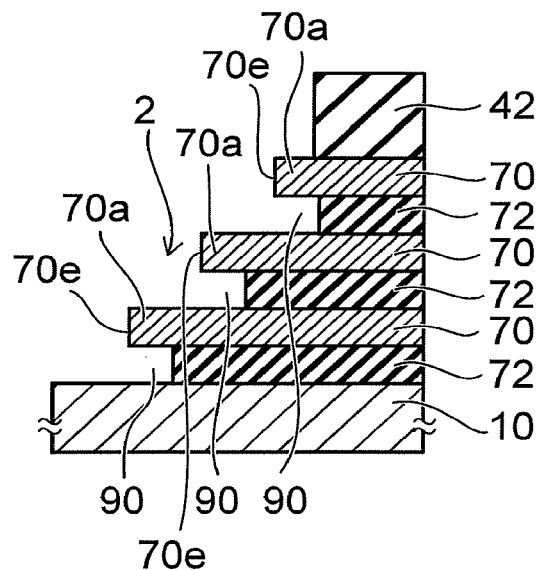

Then, for example, the insulating layers 72 of the staircase-shaped stacked portion 2 are caused to recede in the X-direction from the end surfaces 70e of the tip portions 70a of the conductive layers 70 by performing wet etching using hydrofluoric acid. As shown in FIG. 17A, spaces 90 are formed under the tip portions 70a of the conductive layers 70 by the recession of the insulating layers 72. It is desirable for the recessed amount of the insulating layers 72 to be, for example, about 300 nm to 400 nm to suppress the flex of the tip portions 70a.

Figure 17B:
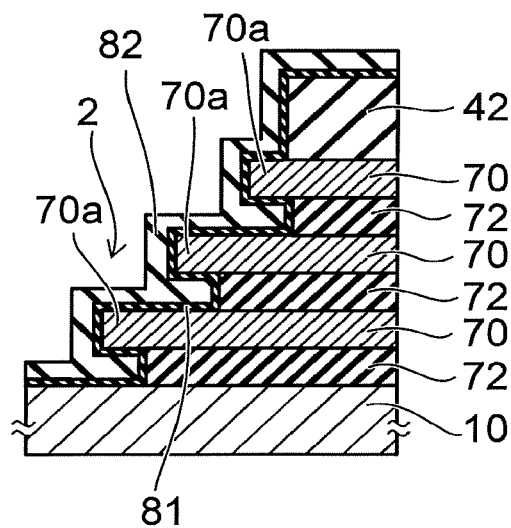

As shown in FIG. 17B, after causing the insulating layers 72 to recede, the first insulating film 81 is formed on the surface of the staircase-shaped stacked portion 2; and the second insulating film 82 is formed to cover the first insulating film 81. For example, the first insulating film 81 is a silicon oxide film; and the second insulating film 82 is a silicon nitride film.

The first insulating film 81 is formed conformally along the surfaces of the conductive layers 70 exposed from the insulating layers 72. The first insulating film 81 is formed also on the surface of the substrate 10 exposed from the insulating layer 72.

Inside the spaces 90, the first insulating film 81 is formed conformally along the end surfaces of the insulating layers 72 and the lower surfaces and upper surfaces of the conductive layers 70 facing the spaces 90. The second insulating film 82 is filled on the inner side of the first insulating film 81 formed inside the spaces 90. The second insulating film 82 covers the first insulating film 81 along the staircase configuration of the staircase-shaped stacked portion 2.

Figure 18A:
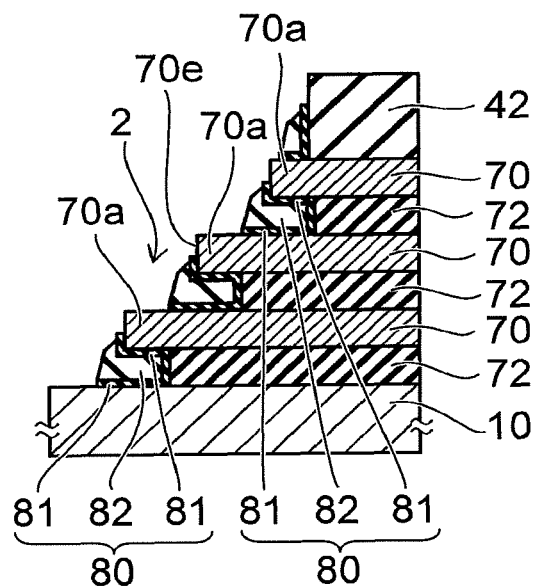

Then, for example, etch-back of the second insulating film 82 is performed using RIE; and a portion of the second insulating film 82 is removed. As shown in FIG. 18A, the second insulating film 82 remains under the tip portion 70a of the conductive layer 70. A portion of the first insulating film 81 is exposed by performing etch-back of the second insulating film 82. For example, etch-back of the exposed first insulating film 81 is performed using RIE; and the first insulating film 81 formed on the upper surface of the tip portion 70a is removed. For the same conductive layer 70, the first insulating film 81 formed on the upper surface of the conductive layer 70 and the lower surface of the conductive layer 70 are separated from each other.

Figure 21A:
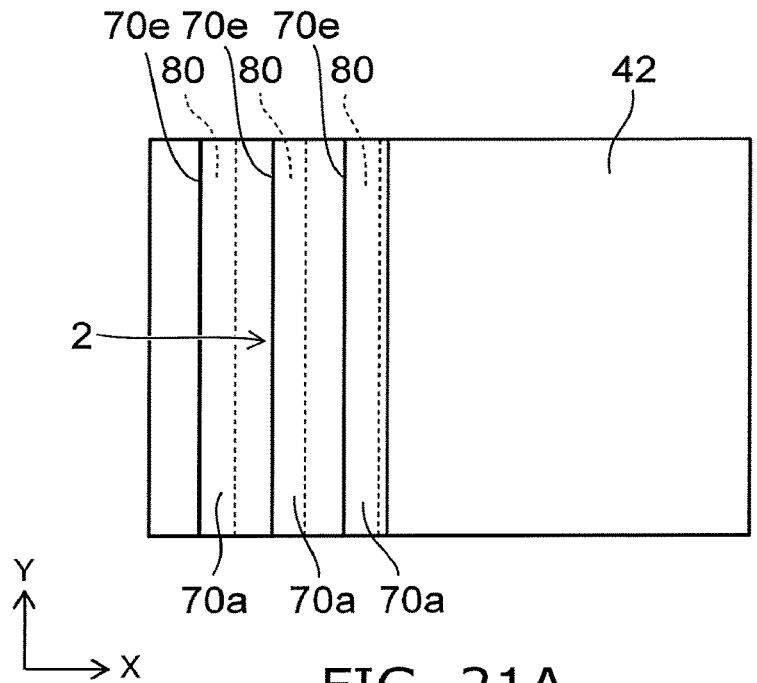
FIG. 21A to FIG. 23B are schematic plan views showing a method for manufacturing the semiconductor device of the embodiment.

As shown in FIG. 18A and FIG. 21A, the spacer 80 having the structure in which the second insulating film 82 is interposed between a pair of first insulating films 81 in the thickness direction of the insulating layer 72 remains under the tip portion 70a of the conductive layer 70.

Figure 18B:
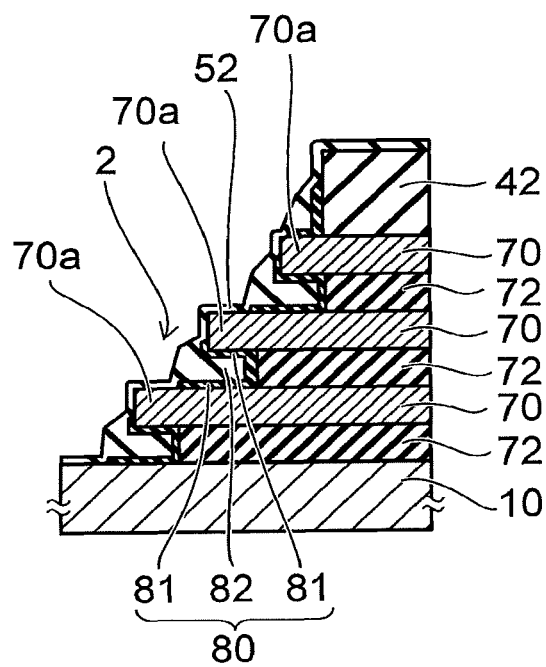

Then, as shown in FIG. 18B, the cover film (the first cover film) 52 is formed on the surface of the staircase-shaped stacked portion 2. The cover film 52 is, for example, a silicon nitride film.

The cover film 52 covers the spacer 80, and contacts and covers the surface of the conductive layer 70 exposed by the division of the first insulating film 81.

Figure 19A:
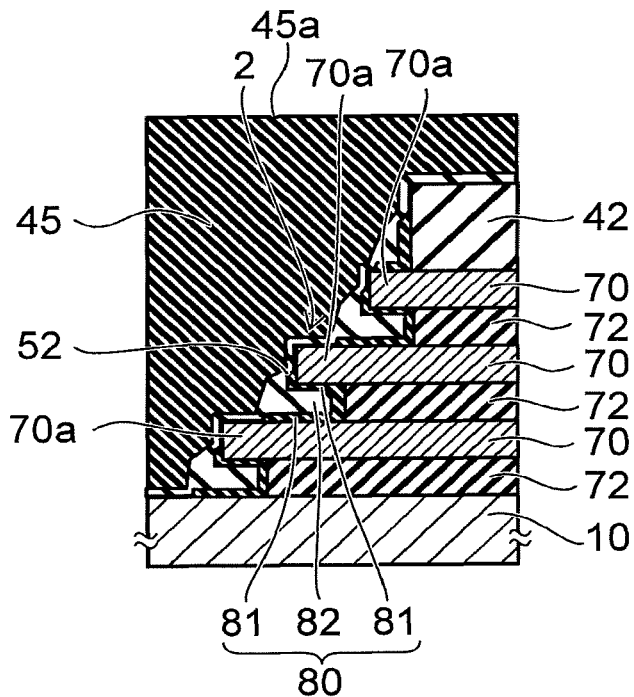

As shown in FIG. 19A, the insulating layer 45 is formed on the cover film 52. The insulating layer 45 is, for example, a silicon oxide layer.

The insulating layer 45 fills the level differences of the surface of the staircase-shaped stacked portion 2. The insulating layer 45 is formed also on the insulating layer 42. The insulating layer 45 on the insulating layer 42 is not illustrated in FIG. 8 to FIG. 14.

For example, the upper surface 45a of the insulating layer 45 is planarized by CMP (chemical mechanical polishing). The upper surface 45a of the insulating layer 45 is at a height higher than the upper surface of the uppermost conductive layer 70.

After planarizing the upper surface of the insulating layer 45, the columnar portions CL are formed in the region where the memory cell array 1 is formed. The columnar portions HR shown in FIG. 4 are formed simultaneously with or separately from the process of forming the columnar portions CL.

Figure 21B:
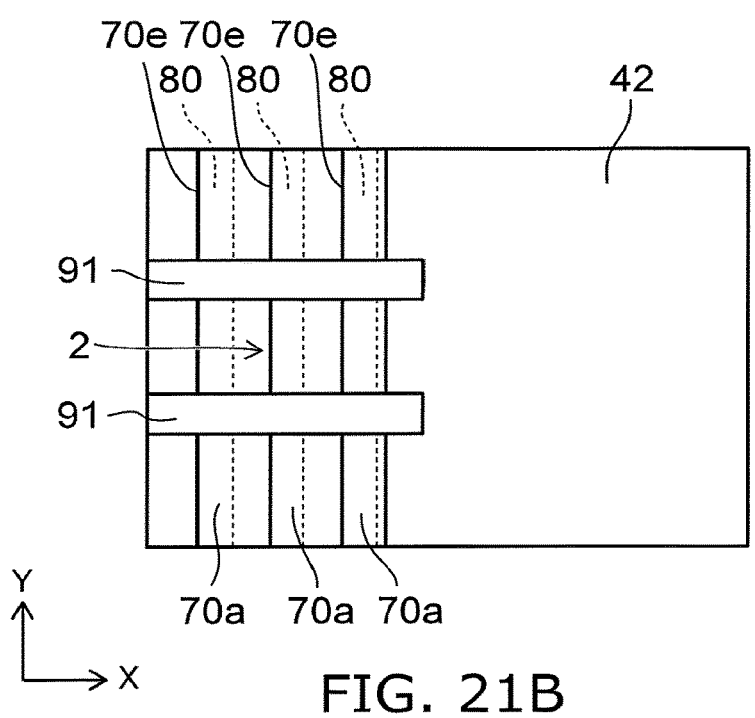

After forming the columnar portions CL and HR, slits 91 are formed in the staircase-shaped stacked portion 2 as shown in FIG. 21B. The slits 91 are formed also in the insulating layer 45 on the staircase-shaped stacked portion 2. The slits 91 extend in the X-direction, and divide the insulating layer 45 and the staircase-shaped stacked portion 2 in the Y-direction. The slits 91 are formed by RIE using a not-illustrated mask layer.

Figure 22A:
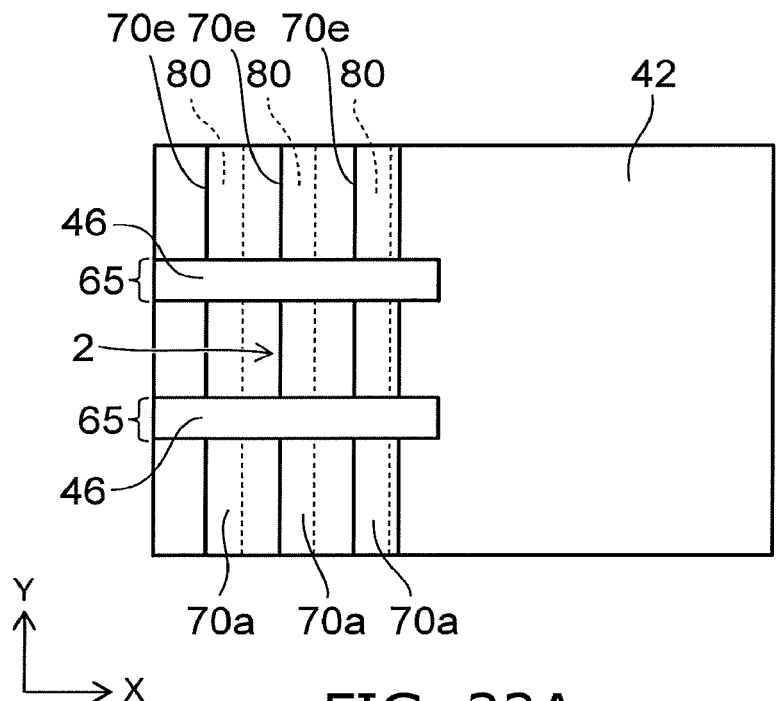

As shown in FIG. 22A, the separation portions 65 are formed by filling the cover film (the second cover film) 46 into the slits 91. The cover film 46 is, for example, a silicon nitride film.

The cover film 46 covers the side surface along the X-direction of the insulating layer 45 exposed in the slits 91. Also, the cover film 46 covers the side surface along the X-direction of the staircase-shaped stacked portion 2 exposed in the slits 91.

The slits 91 also divide the cover film 52 and the spacer 80 in the Y-direction between the insulating layer 45 and the staircase-shaped stacked portion 2; and the cover film 46 also covers the side surfaces of the cover film 52 and the spacer 80 on the slit 91 side.

Figure 19B:
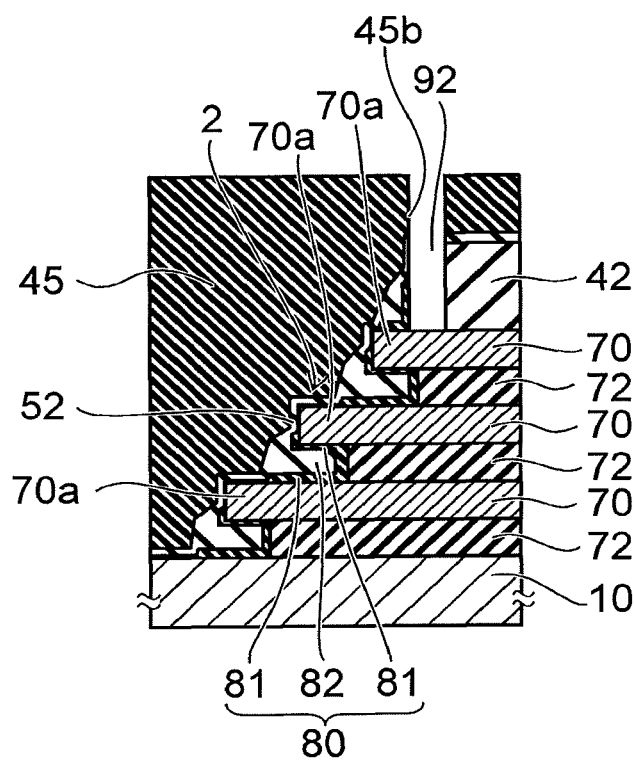
Figure 22B:
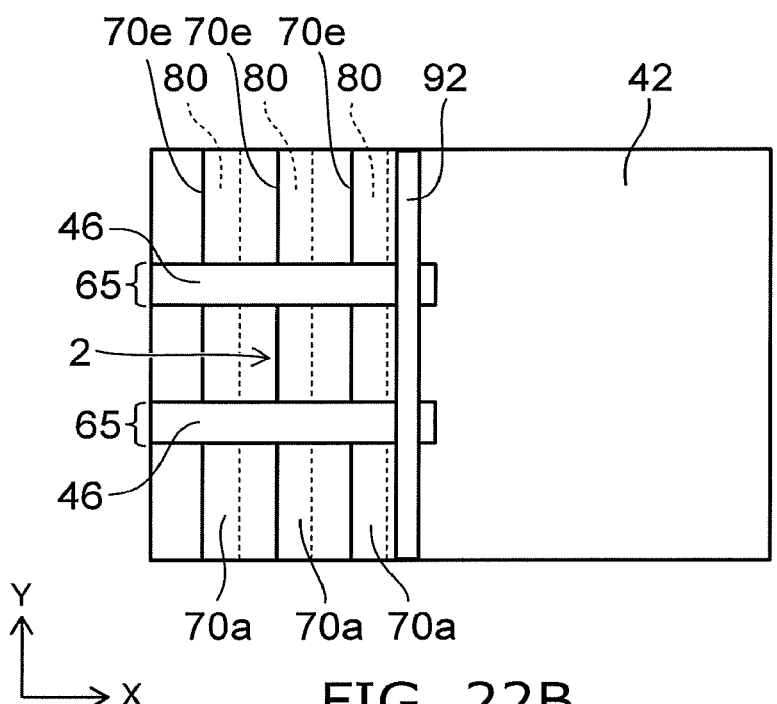

After forming the separation portions 65, a slit 92 is formed in the insulating layer 42 on the uppermost conductive layer 70 and in the insulating layer 45 on the insulating layer 42 as shown in FIG. 19B and FIG. 22B. The slit 92 is formed by RIE using a not-illustrated mask layer. The slit 92 extends in the Y-direction and crosses the separation portions 65.

The insulating layer 45 on the staircase-shaped stacked portion 2 is separated from the stacked portion where the memory cell array 1 is formed by the slit 92. The side surface 45b along the Y-direction of the insulating layer 45 on the staircase-shaped stacked portion 2 is exposed in the slit 92.

Figure 20A:
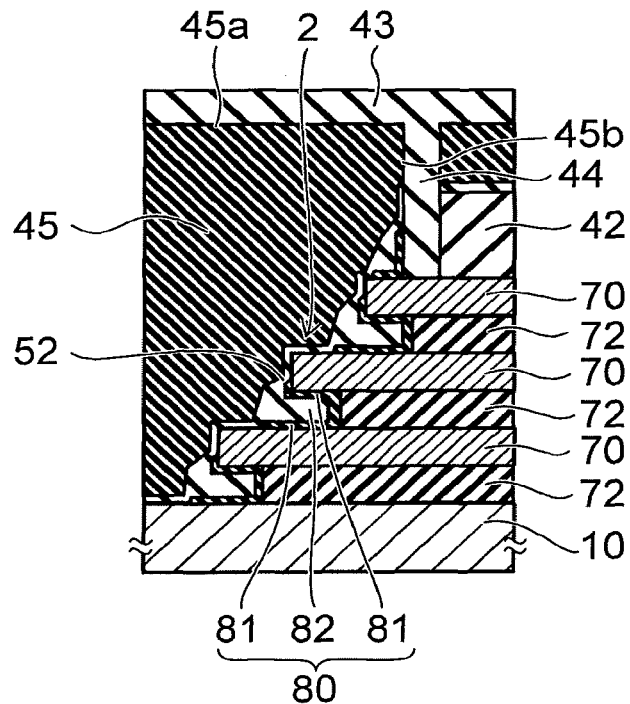
Figure 23A:
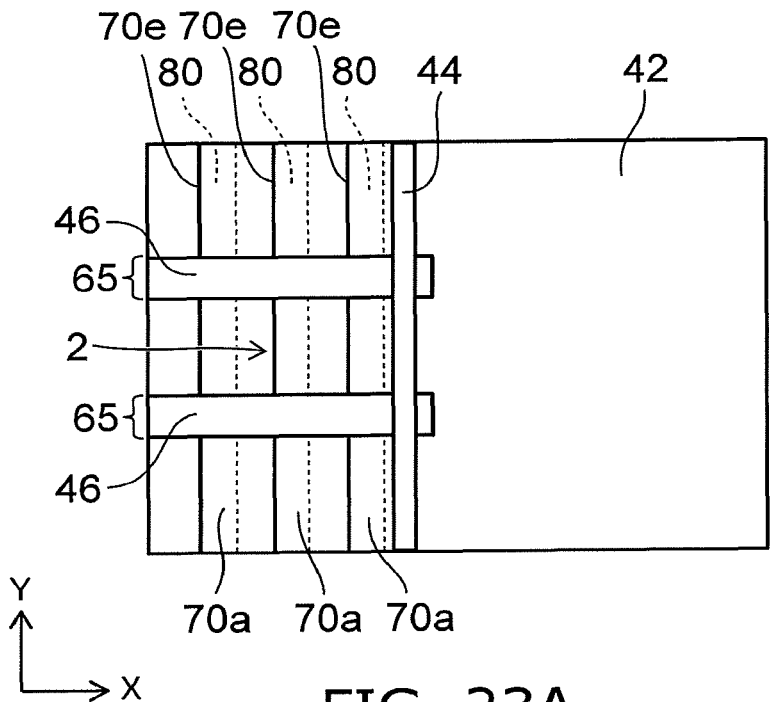

As shown in FIG. 20A and FIG. 23A, the cover film (the third cover film) 44 is filled into the slit 92. The cover film 44 covers the side surface 45b of the insulating layer 45. The cover film 44 is, for example, a silicon nitride film.

As shown in FIG. 20A, the cover film (the fourth cover film) 43 is formed on the upper surface 45a of the insulating layer 45. The cover film 43 covers the upper surface 45a of the insulating layer 45. The cover film 43 is, for example, a silicon nitride film.

Figure 23B:
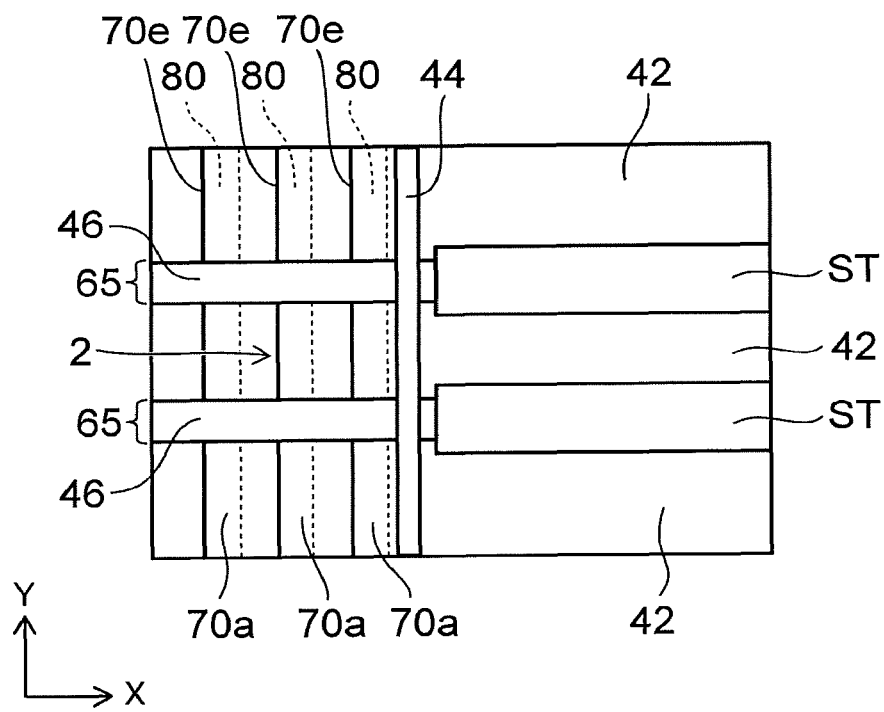

Then, as shown in FIG. 23B and FIG. 14 described above, the slits ST are formed in the stacked portion where the memory cell array 1 is formed.

As shown in FIG. 23B, the slits ST connect the separation portions 65 to slightly overlap the end portions of the separation portions 65. The separation portions 65 and the slits ST extend in the X-direction without interruption and divide the multiple conductive layers 70 into multiple blocks (or fingers) in the Y-direction. Portions that physically link the conductive layers 70 of the blocks (the fingers) to each other in the Y-direction do not remain.

Figure 20B:
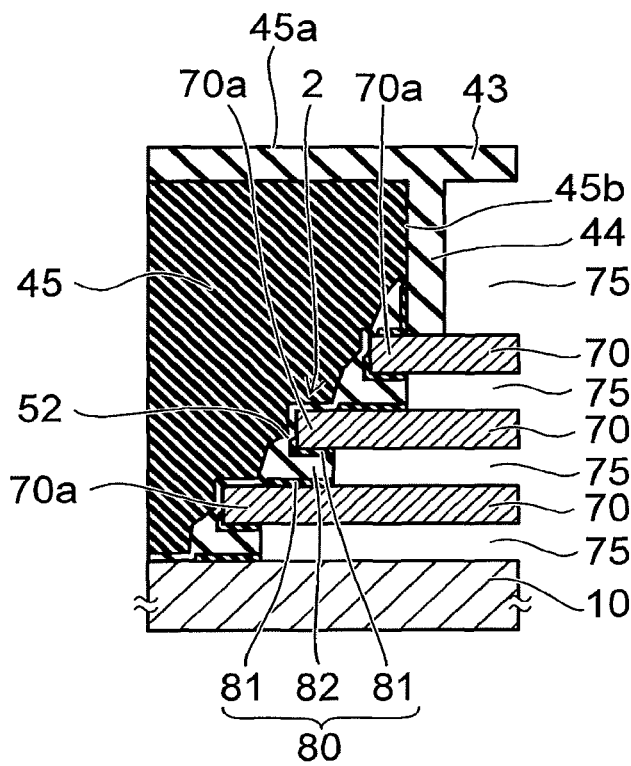

Then, as described above, the insulating layers 72 are removed by etching through the slits ST. As shown in FIG. 15 and FIG. 20B, the gaps 75 are formed between the multiple conductive layers 70. The insulating layer 42 and the insulating layer 45 on the insulating layer 42 which are of the same material as the insulating layers 72 also are removed; and the gap 75 is formed also between the cover film 43 and the conductive layer 70 of the uppermost layer.

The etching of the insulating layers 72 performed using the etchant (or the etching gas) supplied to the slits ST progresses in the Y-direction from the portions facing the slits ST and progresses also in the X-direction toward the staircase-shaped stacked portion 2. At this time, as shown in FIG. 20B, the spacers 80 are used as an etching stopper. The spacers 80 remain under the tip portions 70a of the conductive layers 70 without being consumed.

The insulating layer 45 is the same silicon oxide layer as the insulating layers 72. Therefore, etching of the insulating layer 45 also progresses if there is no spacer 80 and no cover film 52 formed to cover the spacer 80.

According to the embodiment, the cover film 52 and at least the second insulating films 82 of the spacers 80 are silicon nitride films of a material that is different from that of the insulating layers 72, and has etching resistance (etching selectivity) to the etching conditions of the insulating layers 72.

Therefore, the spacers 80 and the cover film 52 can block the etchant (or the etching gas) inside the gaps 75 from reaching the insulating layer 45.

The upper surface 45a of the insulating layer 45 also is covered with the cover film 43 which is a silicon nitride film. As shown in FIG. 4, the side surface along the X-direction of the insulating layer 45 also is covered with the cover film 46 which is a silicon nitride film; and the side surface along the Y-direction of the insulating layer 45 (the side surface 45b shown in FIG. 20B) also is covered with the cover film 44 which is a silicon nitride film.

The cover films 43, 44, and 46 are used as protective films; and the insulating layer 45 is not etched from the upper surface 45a of the insulating layer 45, the side surface of the insulating layer 45 on the separation portion 65 side, and the side surface 45b on the memory cell array 1 side. A temporary mask layer that ultimately does not remain may be used as a cover film covering the upper surface 45a of the insulating layer 45.

Accordingly, the insulating layer 45 is not etched when etching the insulating layers 72 (when forming the gaps 75); and partial hollowing and complete consumption of the insulating layer 45 can be prevented. This prevents the decrease of the mechanical strength of the staircase-shaped stacked portion 2. The subsequent processes (e.g., the formation process of the contact vias CC), etc., can be performed appropriately.

In the embodiment recited above, because the first insulating film 81 of the spacer 80 is the same silicon oxide-type film as the insulating layer 72, the first insulating film 81 formed on the end surface of the second insulating film 82 on the insulating layer 72 side in FIG. 20A also is removed as shown in FIG. 20B. In some cases, the first insulating films 81 provided on and under the second insulating film 82 also may be removed.

Figure 24:
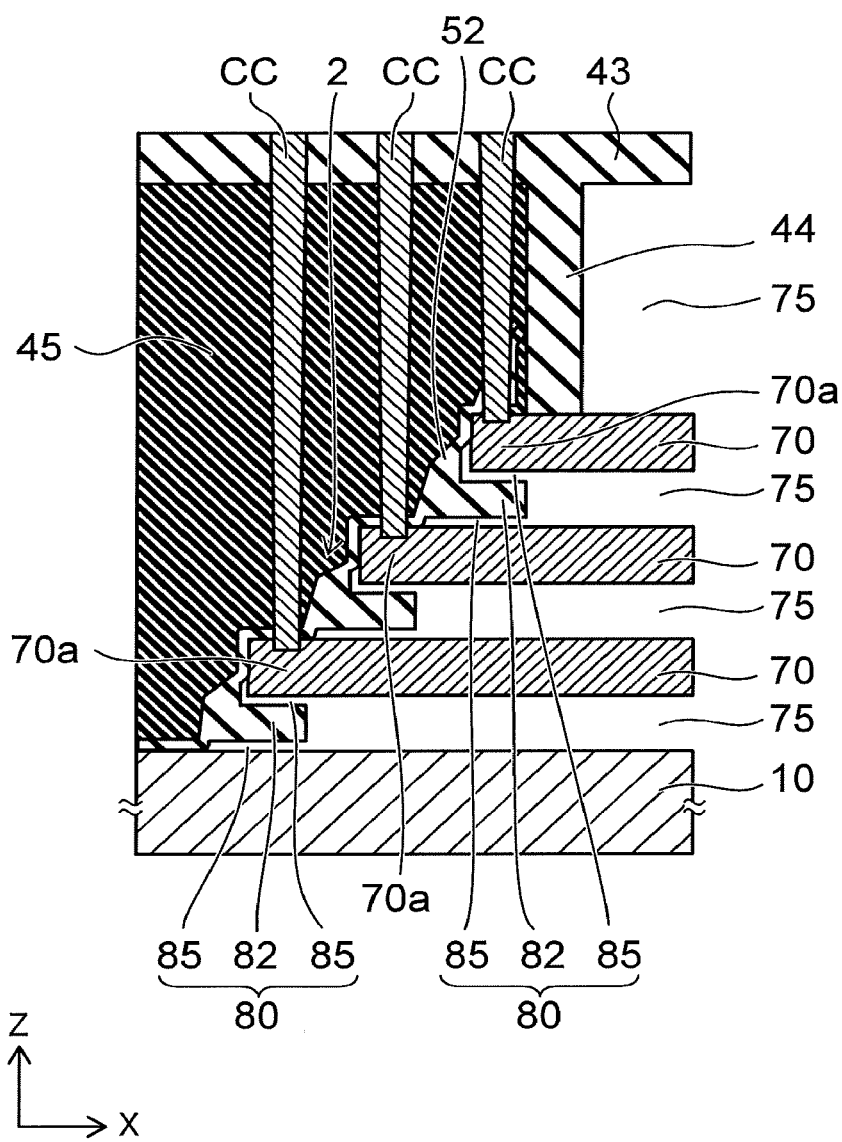
FIG. 24 to FIG. 26 are schematic cross-sectional views of a staircase-shaped stacked portion of the embodiment.

FIG. 24 illustrates an example in which the first insulating films 81 are removed; and gaps 85 are formed on and under the second insulating film 82.

In such a case, the spacer 80 has a structure in which the second insulating film (the silicon nitride film) 82 having a narrower bandgap than the gaps 85 is provided between the pair of gaps 85 used as the first insulators. In other words, the spacer 80 has a trapping property of electrons and can realize a breakdown voltage higher than when the space between the conductive layers 70 adjacent to each other above and below is filled with an insulating film of a single material.

The first insulating films 81 are covered with the cover film 52 and do not contact the insulating layer 45. Therefore, the gaps 85 formed by removing the first insulating films 81 do not reach the insulating layer 45; and the insulating layer 45 is not etched through the gaps 85.

After forming the gaps 75 between the conductive layers 70, the contact vias CC are formed as shown in FIG. 6. First, holes piercing the cover film 43, the insulating layer 45, and the cover film 52 and reaching the tip portions 70a of the conductive layers 70 are formed by RIE using a not-illustrated mask layer. The contact vias CC are formed by filling a conductive material into the holes.

Figure 25:
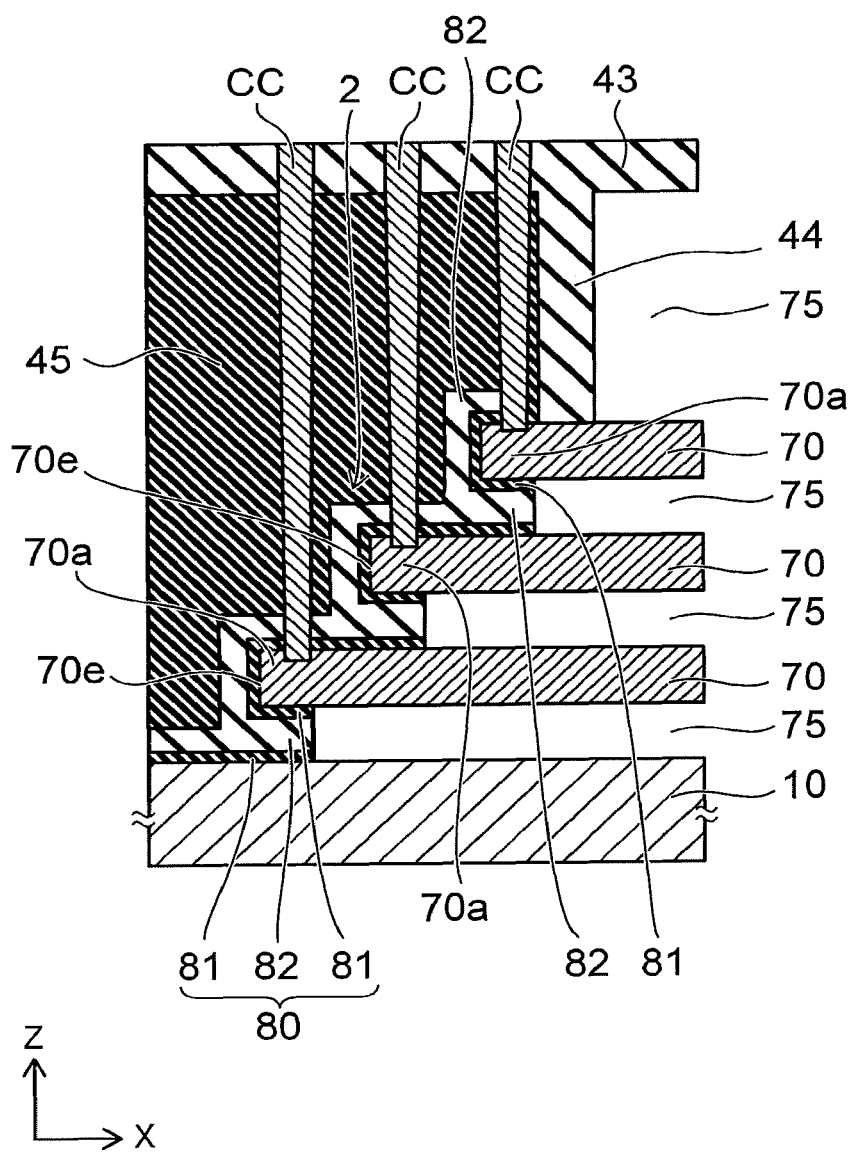

FIG. 25 is a schematic cross-sectional view showing another example of the staircase-shaped stacked portion 2 of the embodiment.

FIG. 25 is obtained by performing the process of FIG. 19A and the subsequent processes after performing the process shown in FIG. 17B without performing the processes of FIGS. 18A and 18B.

The film integrally formed when forming the second insulating film 82 of the spacer 80 becomes the cover film (the first cover film) 82 between the staircase-shaped stacked portion 2 and the insulating layer 45.

The structure of FIG. 25 differs from the structure of FIG. 6 in that the first insulating film 81 formed on the upper surface of the conductive layer 70 and the lower surface of the conductive layer 70 for the same conductive layer 70 is continuous over the end surface 70e of the conductive layer 70.

In the structure of FIG. 25, if the first insulating film 81 also is removed when forming the gap 75, a continuous gap is formed under the cover film 82; and the cover film 82 is in a state of floating above the conductive layer 70. However, the cover film 82 is supported by the multiple columnar portions HR shown in FIG. 4 that pierce the cover film 82.

On the other hand, because the cover film 52 directly contacts the conductive layers 70 when implementing the processes of FIGS. 18A and 18B, the cover film 52 is supported stably on the conductive layers 70 even when the first insulating films 81 are consumed as shown in FIG. 24.

Figure 26:
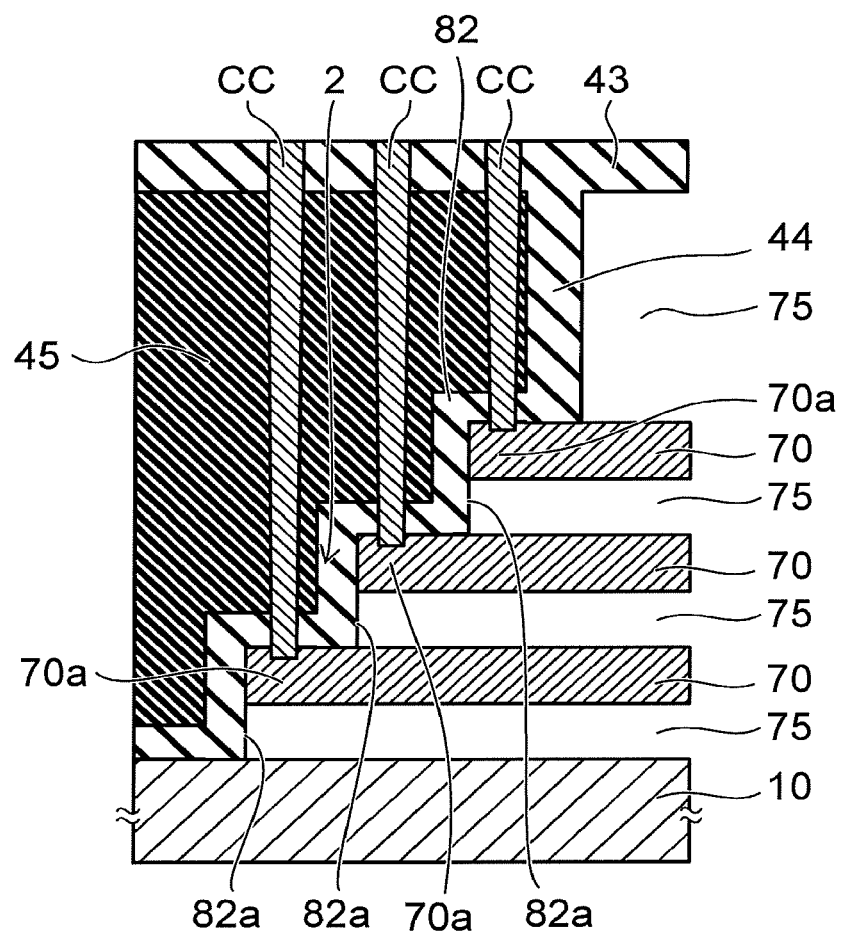

FIG. 26 is a schematic cross-sectional view showing another example of the staircase-shaped stacked portion 2 of the embodiment.

In the structure of FIG. 26, the spacer is not provided under the tip portion 70a of the conductive layer 70. The gaps 75 are formed in all of the regions between the conductive layers 70 adjacent to each other above and below and between the substrate 10 and the lowermost conductive layer 70.

The cover film (the silicon nitride film) 82 provided between the staircase-shaped stacked portion 2 and the insulating layer 45 blocks the etchant (or the etching gas) from reaching the insulating layer 45 through the gaps 75.

In the structure of FIG. 26, the creepage distance between the conductive layers 70 via an end surface 82a of the cover film 82 exposed in the gap 75 becomes short if the spacing of the conductive layers 70 adjacent to each other above and below becomes narrow. In such a case, a dielectric breakdown (breakdown) of the end surface 82a may be caused.

On the other hand, for the spacer 80 of FIG. 6, the surface of the stacked film exposed in the gap 75 has the configuration in which the second insulating film 82 having the relatively narrow bandgap is interposed between the first insulating films 81 having the relatively wide bandgap. Such a structure can have a higher breakdown voltage than in the case where an insulating film of a single material is exposed in the gap 75.

Figure 27:
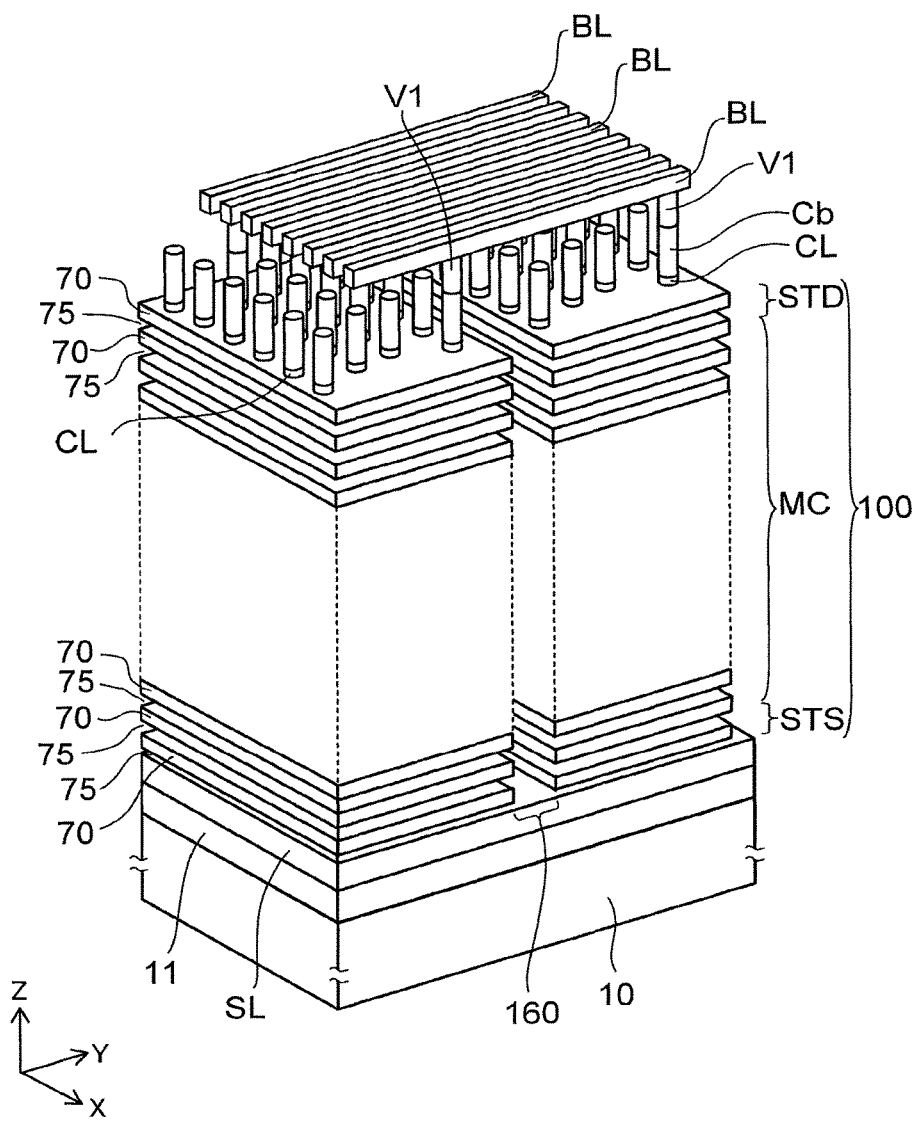
FIG. 27 is a schematic perspective view of a memory cell array of the embodiment.

FIG. 27 is a schematic perspective view of another example of the memory cell array of the embodiment.

Figure 5B:
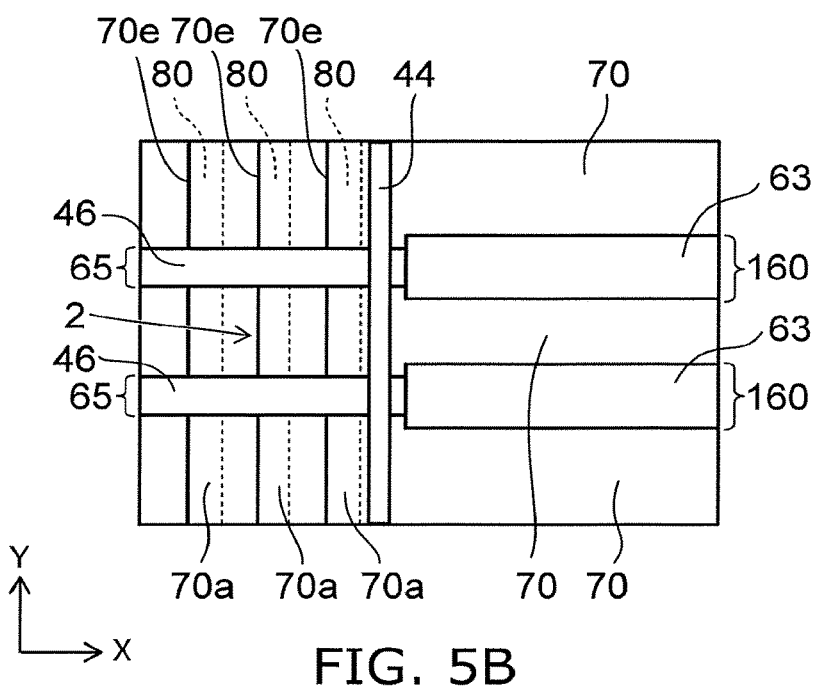

FIG. 5B is a schematic plan view of the memory cell array and the staircase-shaped stacked portion 2 shown in FIG. 27.

A circuit layer 11 and a source layer SL are provided between the substrate 10 and the stacked body 100. The circuit layer 11 is provided between the substrate 10 and the source layer SL; and the source layer SL is provided between the circuit layer 11 and the stacked body 100.

The circuit layer 11 includes, for example, a CMOS circuit. The source layer SL is, for example, a polycrystalline silicon layer doped with an impurity. Or, the source layer SL has a stacked structure of a metal layer and a polycrystalline silicon layer doped with an impurity. The lower end portions of the semiconductor bodies 20 contact the polycrystalline silicon layer of the source layer SL that is used as a foundation layer.

In the stacked body 100, the stacked portion (the memory cell array) where the multiple columnar portions CL are disposed is divided into multiple blocks (or fingers) in the Y-direction by a separation portion 160. The separation portion 160 is made from the insulating film 63 (FIG. 5B) filled into the slit ST described above and does not include an interconnect portion.

According to the embodiments described above, the hollowing of the insulating layer 45 on the staircase-shaped stacked portion 2 (the word line contact region portion) can be prevented while increasing the insulation breakdown voltage between the multiple conductive layers 70.

Although an example is described in the embodiments recited above in which the staircase-shaped stacked portion 2 in which the end portion in the X-direction of the stacked body 100 is formed into a staircase configuration as the word line contact region portion, a structure may be used as the structure of the word line contact region portion in which the end portion of the stacked body 100 has a cliff structure formed substantially perpendicularly to the major surface of the substrate 10, or an oblique surface (a slope) is formed in the end portion of the stacked body 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device, comprising:
a foundation layer;
a stacked body provided above the foundation layer, the stacked body including a plurality of conductive layers stacked with an air gap interposed, the stacked body including a word line contact region portion provided at an end portion in a first direction of the stacked body;
a semiconductor body extending through the stacked body in a stacking direction of the stacked body;
a charge storage portion provided between the semiconductor body and one of the conductive layers;
an insulating layer provided above the word line contact region portion, an upper surface of the insulating layer being at a height higher than an uppermost conductive layer of the conductive layers;
a first cover film provided between the word line contact region portion and the insulating layer, the first cover film being of a material different from a material of the insulating layer;
a first separation portion dividing the insulating layer and the word line contact region portion in a second direction crossing the first direction and including a second cover film of a material different from the material of the insulating layer, the second cover film covering a side surface along the first direction of the insulating layer and a side surface along the first direction of the word line contact region portion; and
a third cover film provided on the uppermost conductive layer, the third cover film covering a side surface along the second direction of the insulating layer, the third cover film being of a material different from the material of the insulating layer.

2. The device according to claim 1, further comprising a fourth cover film covering the upper surface of the insulating layer and being of a material different from the material of the insulating layer.

3. The device according to claim 1, wherein
the insulating layer is a silicon oxide layer, and
the first cover film, the second cover film, and the third cover film are silicon nitride films.

4. The device according to claim 1, further comprising a spacer provided between a tip portion of one of the conductive layers of the word line contact region portion and another of the conductive layers under the tip portion, the spacer including a pair of first insulators and a second insulator, the pair of first insulators being kept away in a height direction of the air gap, the second insulator being provided between the pair of first insulators and having a bandgap narrower than a bandgap of the pair of first insulators.

5. The device according to claim 4, wherein
the first insulator provided on an upper surface of one of the conductive layers and the first insulator provided on a lower surface of the one of the conductive layers are separated from each other, and
the first cover film contacts the tip portion of the one of the conductive layers at a portion where the first insulators are separated.

6. The device according to claim 1, further comprising a second separation portion extending in the first direction, being connected to the first separation portion, and dividing a stacked portion of the stacked body in the second direction, the semiconductor body and the charge storage portion being provided in the stacked portion.

7. The device according to claim 6, wherein
the first separation portion is made of the second cover film, and
the second separation portion includes an interconnect portion and an insulating film, the insulating film being provided between the interconnect portion and the stacked body.

8. The device according to claim 1, further comprising a plurality of contact vias extending through the insulating layer in the stacking direction and contacting the conductive layers of the word line contact region portion.

9. A semiconductor device, comprising:
a foundation layer;
a stacked body provided above the foundation layer, the stacked body including a plurality of conductive layers stacked with an air gap interposed, the stacked body including a word line contact region portion provided at an end portion in a first direction of the stacked body;
a semiconductor body extending through the stacked body in a stacking direction of the stacked body;
a charge storage portion provided between the semiconductor body and one of the conductive layers;
an insulating layer provided above the word line contact region portion;
a first separation portion dividing the insulating layer and the word line contact region portion in a second direction crossing the first direction, the first separation portion including a cover film covering a side surface along the first direction of the insulating layer and a side surface along the first direction of the word line contact region portion, the cover film being of a material different from a material of the insulating layer; and
a spacer provided between a tip portion of one of the conductive layers of the word line contact region portion and another of the conductive layers under the tip portion, the spacer including a pair of first insulators and a second insulator, the pair of first insulators being kept away in a height direction of the air gap, the second insulator being provided between the pair of first insulators and having a bandgap narrower than a bandgap of the pair of first insulators.

10. The device according to claim 9, wherein the pair of first insulators is a silicon oxide film, a carbon-doped silicon oxide film, or an air gap.

11. The device according to claim 9, wherein the second insulator is a silicon nitride film, an aluminum oxide film, a hafnium oxide film, a hafnium silicate film, or a zirconium oxide film.

12. The device according to claim 9, wherein
the first insulator provided on an upper surface of one of the conductive layers and the first insulator provided on a lower surface of the one of the conductive layers are separated from each other.

13. The device according to claim 9, further comprising a plurality of contact vias extending through the insulating layer in the stacking direction and contacting the tip portions of the conductive layers.

14. A method for manufacturing a semiconductor device, comprising:
forming a word line contact region portion at an end portion in a first direction of a stacked body, the stacked body including a plurality of first layers and a plurality of second layers, the first layers and the second layers including a first layer and a second layer stacked alternately;
forming a first cover film at a surface of the word line contact region portion, the first cover film being of a material different from a material of the second layer;
forming an insulating layer on the first cover film, an upper surface of the insulating layer being at a height higher than an uppermost first layer of the first layers, the insulating layer being of a material different from the material of the first cover film;
forming a first slit dividing the insulating layer and the word line contact region portion in a second direction crossing the first direction;
forming a second cover film inside the first slit, the second cover film covering a side surface along the first direction of the insulating layer and a side surface along the first direction of the word line contact region portion, the second cover film being of a material different from the material of the insulating layer;
forming a third cover film on the uppermost first layer, the third cover film covering a side surface along the second direction of the insulating layer above the word line contact region portion, the third cover film being of a material different from the material of the insulating layer;
forming a second slit dividing a stacked portion of the stacked body in the second direction, the stacked portion being positioned on a side opposite to the word line contact region portion with the third cover film interposed; and
forming a gap between the first layers by removing the second layers by performing etching through the second slit.

15. The method according to claim 14, further comprising:
forming, prior to the forming of the first cover film, a space under a tip portion of the first layer by causing the second layer of the word line contact region portion to recede from the first layer; and
forming a spacer in the space, the spacer including a pair of first insulators and a second insulator, the pair of first insulators opposing each other in a stacking direction of the stacked body, the second insulator being provided between the pair of first insulators and having a bandgap narrower than a bandgap of the pair of first insulators.

16. The method according to claim 15, wherein the first cover film is formed after dividing the first insulator provided on an upper surface of one of the first layers and the first insulator provided on a lower surface of the one of the first layers.

17. The method according to claim 14, wherein the second slit is formed on an extension line of the first slit.

18. The method according to claim 14, further comprising forming a plurality of columnar portions piercing the stacked body prior to the forming of the gap.

19. The method according to claim 14, further comprising forming a plurality of contact vias extending through the insulating layer toward the first layers of the word line contact region portion and contacting the first layers.

20. The method according to claim 14, wherein
the second layer and the insulating layer are silicon oxide layers, and
the first cover film, the second cover film, and the third cover film are silicon nitride films.

* * * * *